United States Patent
Hama et al.

(10) Patent No.: US 7,183,219 B1
(45) Date of Patent: Feb. 27, 2007

(54) METHOD OF PLASMA PROCESSING

(75) Inventors: Kiichi Hama, Nagano (JP); Hiroyuki Ishihara, Yamanashi (JP); Akinori Kitamura, Yamanashi (JP)

(73) Assignee: Tokyo Electron AT Limited and Japan Science and Technology Corporation (JP)

( * ) Notice: Subject to any disclaimer, the term of this patent is extended or adjusted under 35 U.S.C. 154(b) by 0 days.

(21) Appl. No.: 09/869,277

(22) PCT Filed: Dec. 21, 1999

(86) PCT No.: PCT/JP99/07176

§ 371 (c)(1),
(2), (4) Date: Jun. 26, 2001

(87) PCT Pub. No.: WO00/41228

PCT Pub. Date: Jul. 13, 2000

(30) Foreign Application Priority Data

Dec. 28, 1998 (JP) .................................. 10/377509
Dec. 28, 1998 (JP) .................................. 10/377510

(51) Int. Cl.
*H01L 21/302* (2006.01)
*H01L 21/3065* (2006.01)

(52) U.S. Cl. ..................................... 438/706; 252/79.1

(58) Field of Classification Search ................ 438/706, 438/710, 712, 700; 252/79.1
See application file for complete search history.

(56) References Cited

U.S. PATENT DOCUMENTS 5,919,332 A    7/1999   Koshiishi et al. ........... 156/345

FOREIGN PATENT DOCUMENTS

| JP | 02-280323 | 11/1990 |
| JP | 05-267231 | 10/1993 |
| JP | 07-263409 | 10/1995 |
| JP | 08-130211 | 5/1996 |
| JP | 09-129611 | 5/1997 |
| JP | 09-181172 | 7/1997 |
| JP | 11-243082 | 9/1999 |

*Primary Examiner*—Nadine G. Norton
*Assistant Examiner*—Lynette T. Umez-Eronini
(74) *Attorney, Agent, or Firm*—Finnegan, Henderson, Farabow, Garrett & Dunner LLP

(57) ABSTRACT

An $SiO_2$ film layer formed at a wafer placed inside a process chamber of an etching device is etched by generating plasma from a process gas containing fluorocarbon which has been introduced into the process chamber. The contents of an etchant and the byproducts are measured through infrared laser absorption analysis. The individual contents thus measured are compared with the contents of the etchant and the byproducts in the plasma corresponding to the increase in the aspect ratio of a contact hole set in advance. The quantity of $O_2$ added into the process gas is adjusted to match the measured contents with the predetermined contents. The quantity of $O_2$ added into the process gas is continuously increased as the aspect ratio becomes higher. As a result, a contact hole is formed at the $SiO_2$ film layer without damaging the photoresist film layer or inducing an etch stop.

19 Claims, 16 Drawing Sheets

LENGTH OF ETCHING
(ASPECT RATIO)

LENGTH OF ETCHING
(ASPECT RATIO)

METHOD OF PLASMA PROCESSING

TECHNICAL FIELD

The present invention relates to a plasma processing method.

BACKGROUND ART

A plasma etching device having an upper electrode and a lower electrode facing opposite each other provided within an airtight process chamber has been proposed in the prior art. When implementing a process with this device, a workpiece such as a semiconductor wafer (hereafter referred to as a "wafer") is placed on the lower electrode. Next, a process gas is introduced into the process chamber and, at the same time, vacuum drawing is implemented in the process chamber to sustain the pressure of the atmosphere inside the process chamber at a predetermined reduced level. Subsequently, high-frequency power is supplied to, for instance, the lower electrode. The application of such high-frequency power causes the process gas to dissociate, resulting in the generation of plasma. Consequently, the wafer becomes etched and contact holes in a specific shape are formed at a specific layer at the wafer, e.g., an $SiO_2$ film layer.

The process gas used when forming contact holes at the $SiO_2$ film layer is constituted of a gas containing, at least, a CF (fluorocarbon) gas and $O_2$, such as a mixed gas containing $C_4F_8$, CO, Ar and $O_2$. When $C_4F_8$ becomes dissociated, radicals such as F*(fluorine radicals) and CF * (fluorocarbon radicals) ions and electrons are generated. The $SiO_2$ film layer is etched as a result of the competing reaction of the radicals and the ions among them. $C_4F_8$ contains carbon (C). Thus, reaction product such as carbon and CF compounds are generated during the process. The reaction product become deposited on and accumulated at the photoresist film layer formed on the $SiO_2$ film layer, most notably at the shoulders of the etching pattern openings. As a result, the shoulders are protected from ion collisions by the reaction product. This prevents the pattern openings from becoming wider, so that small contact holes with specific dimensions are formed.

In addition, $O_2$ is added into the process gas to minimize the occurrence of etch stops. Namely, it has been learned through experience that by adding $O_2$ into the process gas, removal of the reaction product can be facilitated. Thus, as long as $O_2$ is added into the process gas in a correct quantity, the extent to which the reaction product are accumulated at the bottoms of the contact holes is lessened to prevent the occurrence of etch stops. However, if $O_2$ is added into the process gas in an excessive quantity, the reaction product having been accumulated at the photoresist film layer, as well as the reaction product having been accumulated at the bottoms of the contact holes, become removed. This will result in the shoulders becoming etched to cause an increase in the diameter of the pattern openings. Accordingly, $O_2$ is added into the process gas in a quantity that will prevent the occurrence of etch stops but allow the shoulders at the photoresist film layer to be ground only to a relatively small degree during the etching process. For instance, if the flow rates of $C_4F_8$, CO and Ar are respectively 10 sccm ($1.67 \times 10^{-7}$ $m^3$/s in a normal state), 50 sccm ($8.33 \times 10^{-7}$ $m^3$/s in a normal state) and 200 sccm ($33.3 \times 10^{-7}$ $m^3$/s in a normal state), $O_2$ is usually added at a flow rate of 5 sccm($0.833 \times 10^{-7}$ $m^3$/s in a normal state).

An etching method for forming extremely small contact holes by performing an etching process on a wafer with highdensity plasma has been proposed in the prior art. However, when forming contact holes with a high aspect ratio through this etching method, charging damage may occur due to electron shading. In such a situation, it is difficult to form contact holes with a desired shape.

Now, the electron shading phenomenon and the resulting charging damage are explained in reference to FIG. 22. FIG. 22 is a schematic sectional view of a wafer W. The wafer W is constituted by laminating an $SiO_2$ (silicon oxide) film layer 1012 and a photoresist film layer 1014 on a semiconductor substrate 1010. FIG. 22 illustrates a state manifesting the formation of contact holes 1018 at the $SiO_2$ film layer 1012 implemented based upon a pattern 1016 formed at the photoresist film layer 1014 is in progress.

As shown in FIG. 22, electrons ($e^-$) collide with side walls of the pattern 1016 as the contact holes 1018 are etched further and their aspect ratio becomes higher. Positive ions ($I^+$), on the other hand, make entry almost perpendicular to the bottoms of the contact holes 1018. As a result, the side walls of the pattern 1016 and the upper inner walls of the contact holes 1018 become negatively charged. This negative charge forms an electrical field that constitutes an electron barrier. As a result, electrons having only a small velocity component along the direction perpendicular to the bottoms of contact holes 1018 become slowed down by the electrical field and are also bounced back by the electrical field, which prevents them from entering the pattern 1016. This is referred to as the electron shading phenomenon.

When the electron shading phenomenon described above occurs, positive ions enter the bottoms of the contact holes 1018 in a larger quantity compared to the quantity of electrons, as explained earlier. Consequently, the lower walls (side walls) of the contact holes 1018 become a positively charged. As a result, a problem occurs in that the direction along which the ions constituting the etching seed travel is turned toward the side surfaces of the contact holes 1018 due to the charge, to induce abnormalities in shape such as notches. This problem is referred to as charging damage.

As a solution, high-frequency power used to generate plasma is intermittently applied to the upper electrode. This lowers the electron temperature in the plasma so that the radicals are controlled to sustain a specific state. In addition, when the ion sheath becomes dissipated while the supply of the high-frequency power is cut off, negative ions and electrons are drawn to the bottoms of the contact holes 1018 by using biasing power applied to the wafer W. This eliminates the problem of the lower walls becoming positively charged and thus, charging damage is prevented. It is to be noted that the electron temperature refers to the index representing the level of the average thermal motion energy of the electrons in the plasma. In addition, the sheath refers to a space-charge layer formed around the wafer W in the plasma atmosphere.

However, even by adopting the etching method described above, the charging damage cannot be prevented if the internal diameter of the contact holes to be formed is an extremely small at, for instance, approximately 0.18 μm or smaller. In other words, the adverse effect of the electron shading phenomenon becomes more pronounced as the aspect ratio of the contact holes increases. The extent to which the lower walls of the contact holes become positively charged also increases as a result, until the positive charge can no longer be electrically neutralized by the negative ions generated through the disassociation of the process gas. In addition, electrons make isotropical entry. For this reason, while the electrons reach the lower portions of the contact holes, they still do not eliminate the positive charge problem explained above.

The present invention has been completed by addressing the problems of the prior art discussed above. A first object of the present invention is to provide a new and improved plasma processing method that enables formation of contact holes with a high aspect ratio by preventing the occurrence of etch stops without causing damage to the mask pattern.

A second object of the present invention is to provide a new and improved plasma processing method that does not induce charging damage even when contact holes with a high aspect ratio are formed with plasma and enables formation of contact holes with a desired shape.

DISCLOSURE OF THE INVENTION

In order to achieve the objects described above, in a first aspect of the present invention, a plasma processing method for implementing a plasma process on a silicon oxide film layer formed at a workpiece placed inside a process chamber by generating plasma from a process gas containing, at least, fluorocarbon introduced into the process chamber, which is characterized in that oxygen is intermittently added into the process gas, is provided.

In this method, oxygen is added into the process gas intermittently. Thus, even if $O_2$ is added into the process gas in a quantity at which the occurrence of etch stops is prevented while forming contact holes by etching, for instance, an $SiO_2$ film layer, the photoresist film layer on the $SiO_2$ film layer and shoulders of the photoresist film layer do not become damaged readily. For instance, when implementing an etching process by using a process gas containing $C_4F_8$, reaction product are allowed to accumulate at the photoresist film layer while $O_2$ is not being added even if $O_2$ is added in a larger quantity compared to the quantity added in the etching method of the prior art during the periods over which $O_2$ is added. As a result, the photoresist film layer and the shoulders thereof can be protected while preventing the occurrence of etch stops. Consequently, the opening diameter at the pattern formed at the photoresist film layer does not become wider and etch stops do not occur either, thereby enabling formation of contact holes with a high aspect ratio.

In addition, it is desirable to add oxygen into the process gas cyclically (in pulses), in order to improve the reliability with which the occurrence of etch stops is prevented and the reaction product are allowed to accumulate. It will also facilitate control of the quantity of $O_2$ added into the process gas.

The length of the periods over which oxygen is added into the process gas should be set smaller relative to the length of time of the periods over which oxygen is not added. By adding oxygen in this manner, the occurrence of etch stops can be prevented while minimizing the damage to the photoresist film layer and the shoulders even if the total quantity of $O_2$ that is induced (the intake quantity) is equal to or less than the total quantity of $O_2$ taken in through continuous induction as in the prior art.

During the process of forming contact holes at the silicon oxide film layer, the occurrence of etch stops increases in proportion to an increase in the aspect ratio. Accordingly, it is desirable to increase the quantity of oxygen that is added in proportion to the increase in the aspect ratio of the contact holes when forming contact holes at the silicon oxide film layer through a plasma process, in order to ensure that the occurrence of etch stops can be prevented with a high degree of reliability even though the aspect ratio becomes higher as the etching process progresses. In addition, the quantity of $O_2$ that is added can be set low during the initial stage of the process when the aspect ratio is still low, so as to prevent damage to the photoresist film layer. It is to be noted that the term aspect ratio used in the description, the scope of patent claims and the drawings refers to the ratio (b/a) of the internal diameter (width) a and the depth (height) b of contact holes or openings at the pattern formed at the photoresist film layer.

It is also desirable to determine in advance the relationship between the change to occur in the aspect ratio and the change to occur in the plasma composition and to adjust the quantity of oxygen to be added in conformance to the change in the plasma composition. While it is difficult to measure changes occurring in the aspect ratio during the process, the quantity of $O_2$ to be added into the process gas can be adjusted based upon the change in the plasma composition which corresponds to the change in the aspect ratio by adopting the present invention. As a result, the adjustment of the quantity of $O_2$ to be added which should be controlled in conformance to the change in the aspect ratio can be achieved with ease and reliability.

Moreover, since the etch stops described above do not normally occur until the etching process has progressed to a certain degree, the process is not adversely affected by adding $O_2$ after the plasma has stabilized.

In a second aspect of the present invention, a plasma processing method for implementing a plasma process on a silicon oxide film layer formed at a workpiece placed inside a process chamber by generating plasma from a process gas containing, at least, fluorocarbon introduced into the process chamber, which is characterized in that oxygen is added into the process gas with the quantity of oxygen that is added increased/decreased in relative measure, is provided.

In this method, the quantity of $O_2$ added into the process gas is increased/decreased in relative measure. As a result, as in the invention in the first aspect, the occurrence of etch stops is prevented by adding a relatively large quantity of $O_2$. In addition, while the quantity of $O_2$ that is added is relatively small, the reaction product are allowed to accumulate at the photoresist film layer to protect the photoresist film layer. As a result, contact holes with a high aspect ratio can be formed.

It is desirable to cyclically increase/decrease the quantity of oxygen to be added in order to improve the reliability with which the occurrence of etch stops is prevented and the photoresist film layer is protected. It will also facilitate control of the quantity of $O_2$ added into the process gas.

It is also desirable to set the length of time over which the quantity of oxygen added into the process gas is increased short relative to the length of time over which the quantity of oxygen added is reduced. Through this means, the occurrence of etch stops can be prevented while minimizing the damage to the photoresist film layer as described earlier.

The quantity of oxygen added into the process gas should be increased in proportion to the increase in the aspect ratio of the contact holes formed at a silicon oxide film layer through a plasma process. Such an increase in the quantity of oxygen added gas prevents with a high degree of reliability the occurrence of etch stops without damaging the photoresist film even through the aspect ratio becomes higher as the process progresses, as explained earlier.

It is also desirable to determine in advance the relationship between the change to occur in the aspect ratio and the change to occur in the plasma composition and to adjust the quantity of oxygen to be added in conformance to the change in the plasma composition. Through this means, the adjustment of the quantity of $O_2$ to be added which should be controlled in conformance to the change in the aspect ratio can be achieved with ease and reliability, as explained earlier.

Furthermore, it is desirable to increase/decrease the quantity of oxygen added after the plasma becomes stabilized, so as to ensure that plasma is generated with a high degree of reliability. Moreover, the occurrence of etch stops can be prevented reliably while ensuring that the process is not adversely affected by unstable plasma.

In a third aspect of the present invention, a plasma processing method for implementing a plasma process on a silicon oxide film layer formed at a workpiece placed inside a process chamber by generating plasma from a process gas containing, at least, fluorocarbon introduced into the process chamber, which is characterized in that oxygen is added into the process gas with the quantity of oxygen added increased in proportion to the increase in the aspect ratio of contact holes formed at the silicon oxide film layer, is provided.

In this method, the quantity of $O_2$ that is added is increased as the aspect ratio becomes higher, to increase the quantity of $O_2$ induced toward the bottoms of the contact holes. As a result, the occurrence of etch stops due to the increase in the aspect ratio can be prevented with a high degree of reliability. In addition, by adding only a small quantity of $O_2$ while the aspect ratio is low, the total quantity of $O_2$ intake can be reduced compared to that required in the prior art. Thus, damage to the photoresist film layer and the shoulders can be prevented effectively.

It is also desirable to determine in advance the relationship between the change to occur in the aspect ratio and the change to occur in the plasma composition and to adjust the quantity of oxygen to be added into the process gas in conformance to the change in the plasma composition. Through this means, the adjustment of the quantity of $O_2$ added which should be controlled in conformance to the increase in the aspect ratio can be achieved with ease and reliability, as explained earlier.

Furthermore, the quantity of oxygen to be added should be continuously increased or increased in stages. Through such measures, $O_2$ can be added into the process gas in the desirable state in correspondence to the degree of increase in the aspect ratio.

In a fourth aspect of the present invention, a plasma processing method for implementing a plasma process on a silicon oxide film layer formed at a workpiece placed on a second electrode by introducing a process gas containing, at least, fluorocarbon into a process chamber and individually applying high-frequency power to a first electrode and the second electrode facing opposite each other inside the process chamber to raise the process gas to plasma, which is characterized in that the frequency of the high-frequency power applied to the second electrode is set lower than the frequency of the high-frequency power applied to the first electrode with the high-frequency power intermittently applied to the first electrode and oxygen intermittently added into the process gas, is provided.

In this method, electrons and negative ions of oxygen can be generated by dissociating the process gas while the high-frequency power intermittently applied to the first electrode is on. In addition, while the high-frequency power applied to the first electrode is turned off, the electrons and the negative ions mentioned above can be drawn toward the bottoms of the contact holes formed at the $SiO_2$ film layer during a positive cycle of the high-frequency power applied to the second electrode. As a result, the positive charge at the lower walls of the contact holes is electrically neutralized by the electrons and the negative ions. Thus, the problem of the lower walls becoming positively charged is eliminated and charging damage is prevented. It is to be noted that the term "positive cycle" used in this description refers to a period in the entire cycle of the high-frequency power applied to the second electrode, over which the potential at the second electrode is higher than the potential over an area where electrons and negative ions are present in the process chamber (process container).

When $O_2$ is added into the process gas, the photoresist film layer and the pattern shoulders may become ground and damaged. However, $O_2$ is added intermittently into the process gas according to the present invention. Consequently, such damage occurs less readily and contact holes can be formed based upon a specific pattern. Furthermore, the process gas contains a fluorocarbon (CF) gas. Thus, a protective film is formed at the photoresist film layer and the pattern shoulders while the high-frequency power intermittently applied to the first electrode is turned off during a specific etching process. As a result, a further reduction is achieved in the extent of damage occurring as a result of the $O_2$ addition.

It is desirable to add oxygen into the process gas cyclically. This measure ensures that the generation of negative ions of oxygen and the formation of the protective film are achieved with a higher degree of reliability. It also facilitates the control on the quantity of $O_2$ to be added.

In addition, it is desirable to increase the quantity of oxygen to be added in proportion to the increase in the aspect ratio of the contact holes when forming contact holes at a silicon oxide film. The charging damage explained earlier tends to occur more readily as the etching process progresses further and the aspect ratio becomes higher. Accordingly, by increasing the quantity of $O_2$ added into the process gas in proportion to the increase in the aspect ratio, charging damage is reliably prevented even when the etching process has progressed to an advanced state. Moreover, only a small quantity of $O_2$ needs to be added during the initial stage of the process. Thus, the extent of damage to the photoresist film layer and the pattern shoulders is reduced.

In a fifth aspect of the present invention, a plasma processing method for implementing a plasma process on a silicon oxide film layer formed at a workpiece placed on a second electrode by introducing a process gas containing, at least, fluorocarbon and oxygen into a process chamber and individually applying high-frequency power to a first electrode and the second electrode facing opposite each other inside the process chamber to raise the process gas to plasma, which is characterized in that the frequency of the high-frequency power applied to the second electrode is set lower than the frequency of the high-frequency power applied to the first electrode with the high-frequency power intermittently applied to the first electrode and the quantity of oxygen added into the process gas increased/decreased while the plasma process is in progress, is provided.

In this method, $O_2$ is added into the process gas. Thus, as in the invention in the fourth aspect explained above, charging damage attributable to the increase in the aspect ratio is prevented. In addition, while the quantity of $O_2$ being added is increased, a greater quantity of negative oxygen ions can be generated. Furthermore, when the quantity of $O_2$ being added is reduced, the photoresist film layer and the pattern shoulders can be protected with the protective film formed with the CF gas. Consequently, a specific patterning is achieved while eliminating charging damage.

In a sixth aspect of the present invention, a plasma processing method for implementing a plasma process on a silicon oxide film layer formed at a workpiece placed on a second electrode by introducing a process gas containing, at least, fluorocarbon and oxygen into a process chamber and individually applying high-frequency power to a first electrode and the second electrode facing opposite each other inside the process chamber to raise the process gas to plasma, which is characterized in that the frequency of the high-frequency power applied to the second electrode is set lower than the frequency of the high-frequency power applied to the first electrode with the high-frequency power intermittently applied to the first electrode and the quantity of oxygen added into the process gas increased as the plasma process progresses, is provided.

In this method, the process is implemented by gradually increasing the quantity of $O_2$ added into the process gas. Thus, since the quantity of $O_2$ being added during the initial stage of the process is small, the entire quantity of $O_2$ that is added (the intake quantity) can be kept at a level equal to or lower than induction quantity necessitated in continuous induction of $O_2$. As a result, the photoresist film and the shoulders do not become damaged readily. In addition, with the quantity of $O_2$ being added increased as the process progresses, $O_2$, which is added only in a small quantity during the initial stage of the process, can be subsequently replenished. As a result, charging damage can be prevented with a high degree of reliability.

It is desirable to increase the quantity of oxygen added into the process gas in proportion to the increase in the aspect ratio of the contact holes when forming contact holes at a silicon oxide film layer. Through this measure, it is ensured that negative oxygen ions are generated in greater quantity as the aspect ratio becomes higher. Consequently, charging damage is prevented with an even higher degree of reliability.

BEST MODE FOR CARRYING OUT OF THE INVENTION

The following is an explanation of embodiments achieved by adopting the plasma processing method according to the present invention in a plasma etching method, given in reference to the attached drawings. It is to be noted that in the explanation of the embodiments, the same reference numbers are assigned to components having functions and structural features roughly identical to one another to preclude the necessity for repeated explanation thereof.

First Embodiment

First, a first embodiment of the present invention is explained. This embodiment is characterized in that $O_2$ is intermittently added into the process gas. The following is a detailed description of the structure adopted to achieve this.

(1) Structure of etching device

Figure 1:
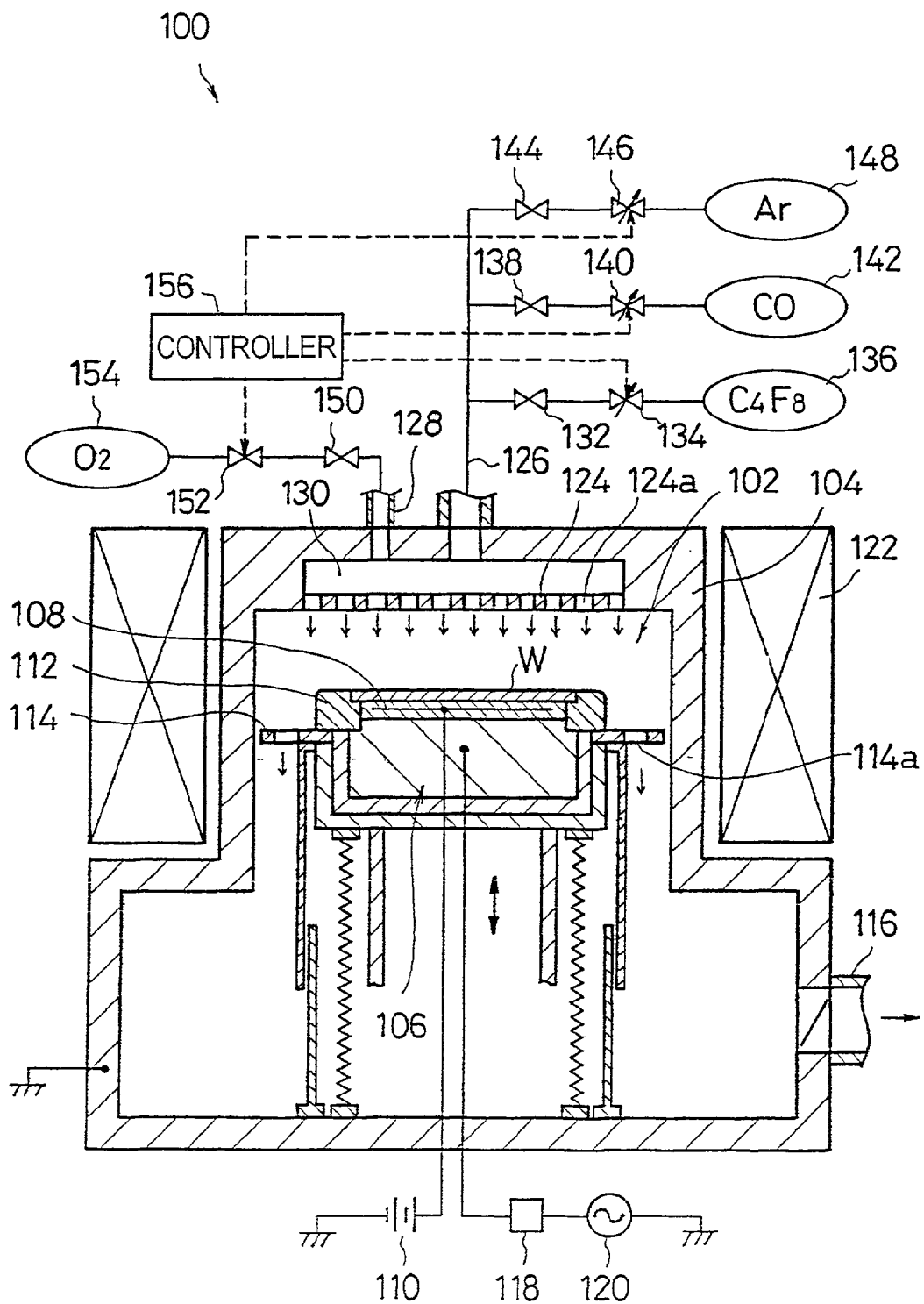
FIG. 1 is a schematic sectional view of an etching device that may adopt the present invention.

An etching device 100 in which the embodiment may be adopted is structured as shown in FIG. 1. Namely, a process chamber 102 of the etching device 100 is formed within an electrically conductive and airtight process container 104. A magnet 122 is provided outside the process chamber 102. The magnet 122 generates a magnetic field (rotating magnetic field) inside the process chamber 102.

A conductive lower electrode 106 is provided inside the process chamber 102. The lower electrode 106 also functions as a stage on which a wafer W is placed. In addition, a high-frequency power supply 120, which outputs high-frequency power, is connected to the lower electrode 106 via a matcher 118. An electrostatic chuck 108 is provided on the lower electrode 106. The electrostatic chuck 108 attracts and holds the wafer W when a high level DC voltage output from a high-voltage D.C. power supply 110 is applied to it. A focus ring 112 is provided on the lower electrode 106 as well. The focus ring 112 encloses the periphery of the wafer W placed on the electrostatic chuck 108.

A baffle plate 114 is mounted around the lower electrode 106. A plurality of through holes 114a are formed at the baffle plate 114. The through holes 114a communicate between the space inside the process chamber 102 and the lower space inside the process container 104. A vacuum pump (not shown) is connected via an evacuating pipe 116 to the lower space within the process container 104.

A conductive upper electrode 124 is provided so as to face opposite the mounting surface of the lower electrode 106. The upper electrode 124, which constitutes the ceiling of the process chamber 102, is grounded via the process container 104. In addition, numerous gas outlet holes 124a are formed at the upper electrode 124. A first gas supply pipe 126 and a second gas supply pipe 128 are connected to the gas outlet holes 124a via a gas diffusion chamber 130.

First~third gas supply sources 136, 142 and 148 are connected to the first gas supply pipe 126 respectively via first~third flow-regulating valves (mass flow controllers) 134, 140 and 146 and first~third switching valves 132, 138 and 144. It is to be noted that $C_4F_8$ is supplied from the first gas supply source 136 in the embodiment. CO is supplied from the second gas supply source 142 and Ar is supplied from the third gas supply source 148.

A fourth gas supply source 154 is connected to the second gas supply pipe 128 via a fourth flow-regulating valve 152 and a fourth switching valve 150. $O_2$ is supplied from the fourth gas supply source 154. In addition, a controller 156 is connected to the first~fourth flow-regulating valves 134, 140, 146 and 152. The controller 156 controls the flow rates of the individual gases as explained later.

(2) A Phenomenon in Which Etch Stops are Prevented by Adding $O_2$

Next, the phenomenon in which etch stops are prevented by adding $O_2$ into the process gas is explained in reference to FIG. 2. According to findings made by the inventor of the present invention and others, the following two theories are considered to be the primary theoretical basis that may be applied when explaining how etch stops can be prevented by adding $O_2$.

(a) First Theory

Figure 2A:
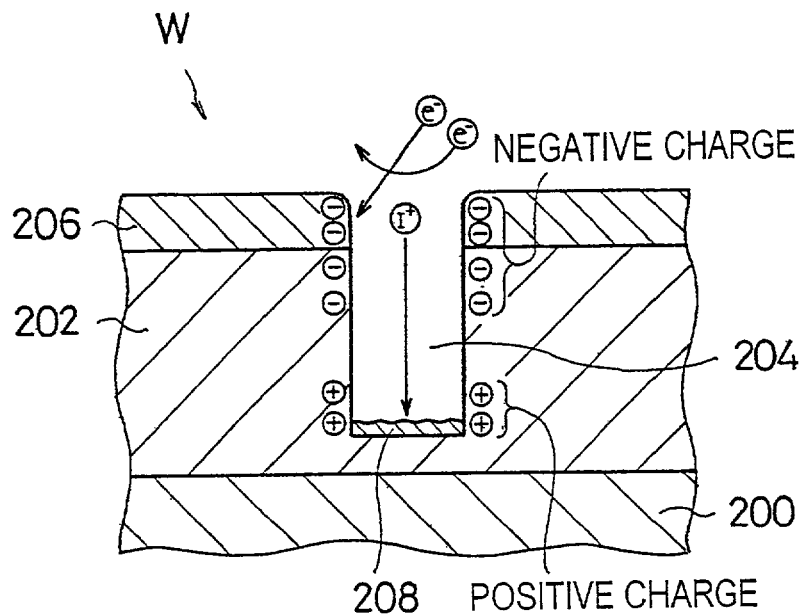
FIG. 2(a) schematically illustrates a first theory of the phenomenon in which etch stops are prevented by adding $O_2$ and FIG. 2(b) schematically illustrates a second theory of the phenomenon in which etch stops are prevented by adding $O_2$.

Let us hypothesize that an etching process is implemented on an $SiO_2$ film layer 202 formed on an Si (silicon) substrate 200 by using, for instance, a mixed gas containing $C_4F_8$, CO and Ar without adding $O_2$. In the process, a contact hole 204 is formed at the $SiO_2$ film layer 202, as shown in FIG. 2(a). During this process, positive ions (I +) become accelerated by the sheath and enter the contact hole 204. However, electrons (e −) make isotropical entry into the contact hole 204. For this reason, as the hole diameter (internal diameter) of the contact hole 204 becomes small, some electrons do not enter the contact hole 204. As a result, the lower side wall inside the contact hole 204 becomes charged with positive (+) charge.

When the lower side wall becomes positively charged to a certain extent, ions can no longer enter the contact hole 204. As a result, ions no longer reach the bottom surface of the contact hole 204. This disrupts the balance between the radicals and the ions, to result in an etch stop. However, the lower side wall inside the contact hole 204 is not positively charged to any significant degree if the aspect ratio is low. For this reason, the balance between the radicals and the ions is not disrupted and therefore, no etch stop occurs. In contrast, if the aspect ratio is high, ions are prevented from reaching the bottom of the contact hole 204 as described above. Thus, the ratio of ions and radicals changes and an etch stop occurs.

If $O_2$ is added into the process gas, $O_2$ becomes dissociated to generate O* (oxygen radicals) and negative ions. The problem of the lower side wall becoming positively charged is eliminated by the presence of the negative O ions and O* as the negative O ions enter the contact hole 204. Thus, ions are allowed to reach the bottom of the contact hole 204 even when forming an extremely small contact hole 204 having an internal diameter of approximately 0.18 μm or smaller. Then, the ions, $C_xF_y$, radicals and $SiO_2$ undergo a reaction while maintaining a correct balance among themselves. The $SiO_2$ film layer 202 at the bottom of the contact hole 204 is etched to the correct degree and the occurrence of an etch stop is prevented.

(b) Second Theory

Figure 2B:
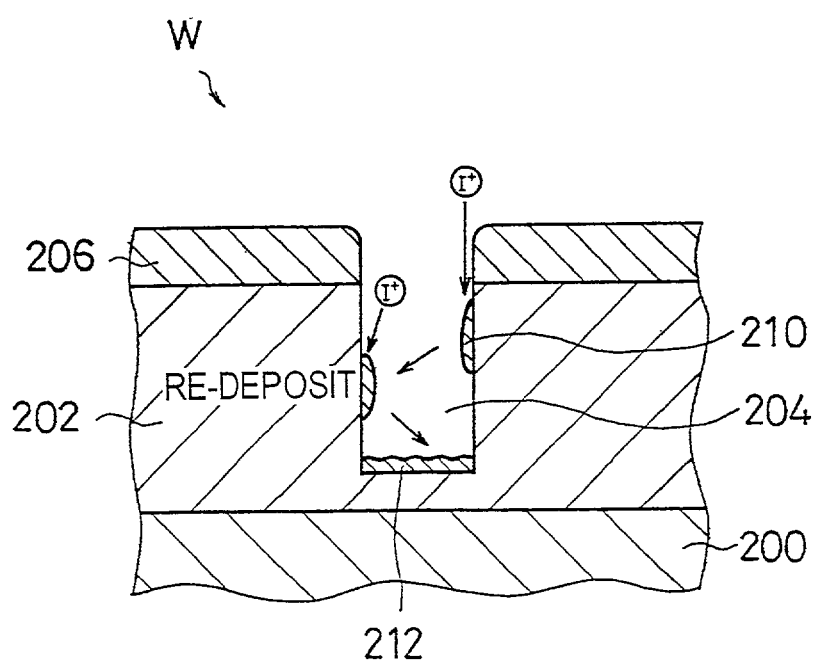

The deposit seed, which has a large solid angle of entry, is readily accumulated at the upper side wall inside the contact hole 204 as shown in FIG. 2(b), resulting in the formation of a $CF_x$ polymer (deposit) 210. Then, ions (I+) collide with the $CF_x$ polymer 210, causing a component with a high C/F ratio to become sputtered toward the bottom of the contact hole 204. In other words, the $CF_x$ polymer 210 is repeatedly sputtered and re-deposited, resulting in the formation of a deposit (reaction product) 212 which is rich in carbon. This deposit 212 presents a main cause of the etching rate at which the $SiO_2$ film layer 202 is etched in the very small contact hole 204 becoming slowed down. Accordingly, it is crucial to achieve verticality for the side wall of the contact hole 204 by taking into account the adverse effect of the deposit 212.

When $O_2$ is added into the process gas, O* generated through the dissociation of $O_2$ as explained above reacts with the deposit 212 at the bottom of the contact hole 204. As a result, the deposit 212 is expelled from the contact hole 204 in the form of, for instance, CO, $CO_2$, $COF_x$ and the like. Thus, the deposit 212 which has accumulated at the bottom of the contact hole 204 and is not etched readily becomes removed. This sets the etching balance between ions 210 and radicals to the correct ratio, to successfully prevent the occurrence of etch stop.

Etch stops can be prevented by adding $O_2$ into the process gas based upon either the first theory or the second theory explained above. However, in order to ensure that the occurrence of etch stops is prevented with a high degree of reliability, the quantity of $O_2$ being added must be increased in proportion to the increase in the aspect ratio of the contact hole 204 (as the contact hole 204 becomes narrower). If the quantity of $O_2$ added into the process gas remains constant, as in the etching method in the prior art explained earlier, the photoresist film layer 206 on the $SiO_2$ film layer 202 and the shoulders of the photoresist film layer 206 become etched as well. Accordingly, $O_2$ is added into the process gas in the embodiment by alternating a period over which $O_2$ is supplied and a period over which the $O_2$ supply is suspended over specific intervals as explained below. In addition, during an $O_2$ supply period $O_2$ is added into the process gas in the quantity at which the concurrence of etch stops can be reliably prevented. Through these measures, it becomes possible to form a contact hole 204 with a high aspect ratio without damaging the photoresist film layer 206.

Figure 3:
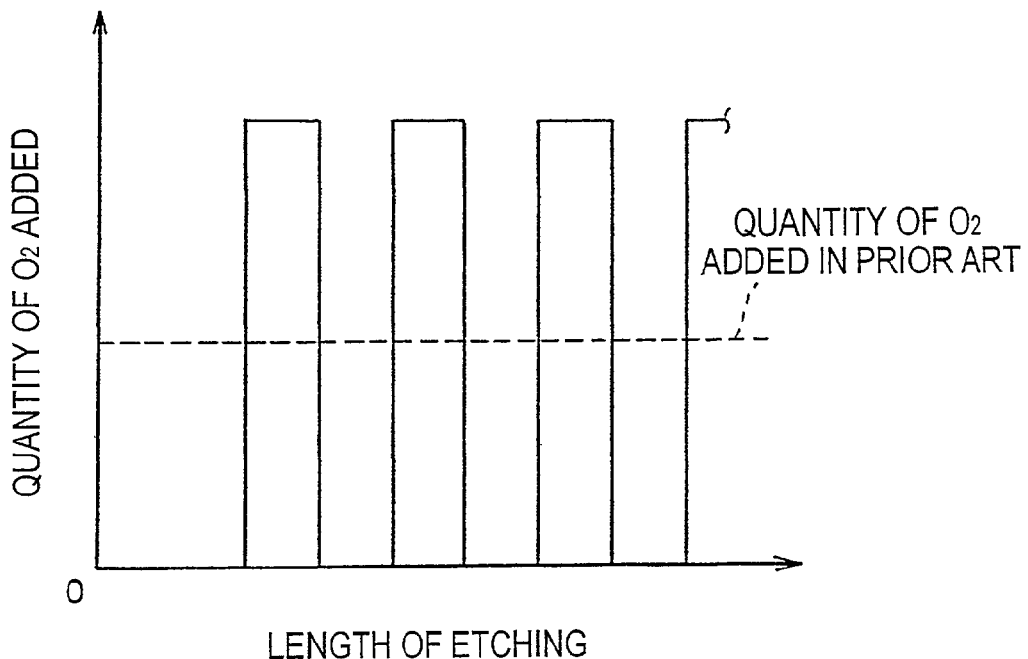
FIG. 3 schematically illustrates the structure of the control on the quantity of $O_2$ that is added, adopted in the etching device in FIG. 1.

(3) The Etching Step and Structure Adopted to Implement Control on Quantity of $O_2$ Being Added Next, in reference to FIGS. 1~3, the etching step and the structure adopted to implement control on the quantity of $O_2$ being added (the flow rate) that characterize the embodiment are explained.

First, as shown in FIG. 1, the wafer W placed on the electrostatic chuck 108 of the lower electrode 106 is attracted and held to the electrostatic chuck 108. At this time, the temperature of the wafer W is set at a specific level, e.g., 20° C., via the lower electrode 106. In addition, the $SiO_2$ film layer 202 has been formed on the Si substrate 200 at the wafer W as shown in FIG. 2. The upper surface of the $SiO_2$ film layer 202 is covered by the photoresist film layer 206 having a specific pattern formed therein. The temperature at the inner wall surface of the process chamber 102 and the upper electrode 124 shown in FIG. 1 is set at, for instance, 60° C.

Next, the controller 156 adjusts the first~third flow-regulating valves 134, 140 and 146 as appropriate. Through this adjustment, $C_4F_8$, CO and Ar constituting the mixed gas are individually introduced into the process chamber 102 at specific flow rates. At this time, the flow rate of $C_4F_8$ is set at, for instance, 10 sccm ($1.67 \times 10^{-7}$ $m^3/s$ in a normal state), the flow rate of CO is set at, for instance, 50 sccm ($8.33 \times 10^{-7}$ $m^3/s$ and the normal state) and the flow rate of Ar is set at 200 sccm ($33.3 \times 10^{-7}$ $m^3/s$ in a normal state). The fourth flow-regulating valve 152 remains closed. Thus, $O_2$ is not supplied in this state. Concurrently, vacuum drawing is implemented inside the process chamber 102 via the through holes 114a of the baffle plate 114 and the evacuating pipe 116, to sustain the pressure inside the process chamber 102 at, for instance, 40 mTorr (5.3 Pa). Then, high-frequency power with a frequency of, for instance, 13.56 MHz and a power level of 1700 W is applied to the lower electrode 106. The application of such power results in generation of plasma between the upper electrode 124 and the lower electrode 106. Consequently, a specific type of etching process is implemented on the $SiO_2$ film layer 202 by the ions and the radicals in the plasma.

The state of the plasma generation is monitored by a sensor (not shown). The sensor monitors the state of the plasma generation by detecting the emission spectrum of the plasma, for instance. The information obtained at the sensor is communicated to the controller 156. Once the controller 156 judges that the plasma has stabilized and a stable etching process is being implemented on the $SiO_2$ film layer 202, it applies a specific level of pulse voltage to the fourth flow-regulating valve 152. While the pulse voltage is on, the fourth flow-regulating valve 152 is open to allow $O_2$ to be supplied into the gas diffusion chamber 130. While the pulse voltage is suspended, on the other hand, the fourth flow-regulating valve 152 is closed and the supply of $O_2$ into the gas diffusion chamber 130 is stopped. As a result, $O_2$ is added into the process gas present inside the gas diffusion chamber 130 in synchronization with the ON/OFF state of the pulse voltage as shown in FIG. 3. The process gas is supplied into the process chamber 102 via the gas outlet holes 124a.

In addition, the maximum flow rate of $O_2$ being added is set higher than the flow rate of $O_2$ added in the etching method in the prior art. This maximum flow rate is set at, for instance, 10 sccm ($1.67 \times 10^{-7}$ $m^3/s$ in a normal state) in the embodiment. The length of time over which $O_2$ is added per cycle is set at several ms~several tens of ms, e.g., 5 ms~10 ms. The length of time over which $O_2$ is not supplied is set larger than the length of time over which $O_2$ is added. Thus, $O_2$ is supplied over a shorter length of time than that over which $O_2$ is not supplied. Consequently, it is possible to form a reaction product (protective film) such as a CF compound at the photoresist film layer 206 even when $O_2$ is added into the process gas in a quantity at which the photoresist film layer 206 would become ground if $O_2$ was added constantly. As a result, the shoulders of the photoresist film layer 206 which tend to be damaged readily are not ground. Furthermore, the total quantity of $O_2$ that is introduced into the process gas is equal to or smaller than the total quantity of $O_2$ that is continuously introduced into the process gas in the prior art. Thus, the occurrence of damage described above can be prevented with a high degree of reliability.

In the embodiment structured as described above, the supply of $O_2$ added into the process gas is switched ON/OFF in a specific cycle. As a result, the internal side wall of the contact hole 204 is prevented from becoming charged while maintaining the pattern formed at the photoresist film layer 206 in its initial state. In addition, since the accumulation of the reaction product (deposits) 208 and 212 at the bottom of the contact hole 204 is minimized, the occurrence of an etch stop can be prevented.

Second Embodiment

Next, a second embodiment of the present invention is explained. This embodiment is characterized in that the quantity of $O_2$ being added is increased/decreased in relative measure.

$C_4F_8$, CO and Ar, for instance, constituting a mixed gas are introduced into the process chamber 102 respectively at the same flow rates as those in first embodiment, prior to plasma generation. Accordingly, the flow rate of $C_4F_8$ is set at 10 sccm ($1.67 \times 10^{-7}$ $m^3/s$ in a normal state), the flow rate of CO is set at 50 sccm ($8.33 \times 10^{-7}$ $m^3/s$ in a normal state) and the flow rate of Ar is set at 200 sccm ($33.3 \times 10^{-7}$ $m^3/s$ in a normal state). Unlike in the first embodiment, $O_2$ is introduced into the process chamber 102 at a flow rate of, for instance, 5 sccm ($0.833 \times 10^{-7}$ $m^3/s$ in a normal state) at the same time. At this time, the flow rates of the individual gases are adjusted through the voltages applied by the controller 156 to the first~fourth flow-regulating valves 134, 140, 146 and 152. It is to be noted that $O_2$ is added into the process gas prior to the plasma generation in the embodiment. However, $O_2$ is added in a very small quantity. For this reason, the addition of $O_2$ does not affect the plasma generation or the photoresist film layer 206.

Figure 4:
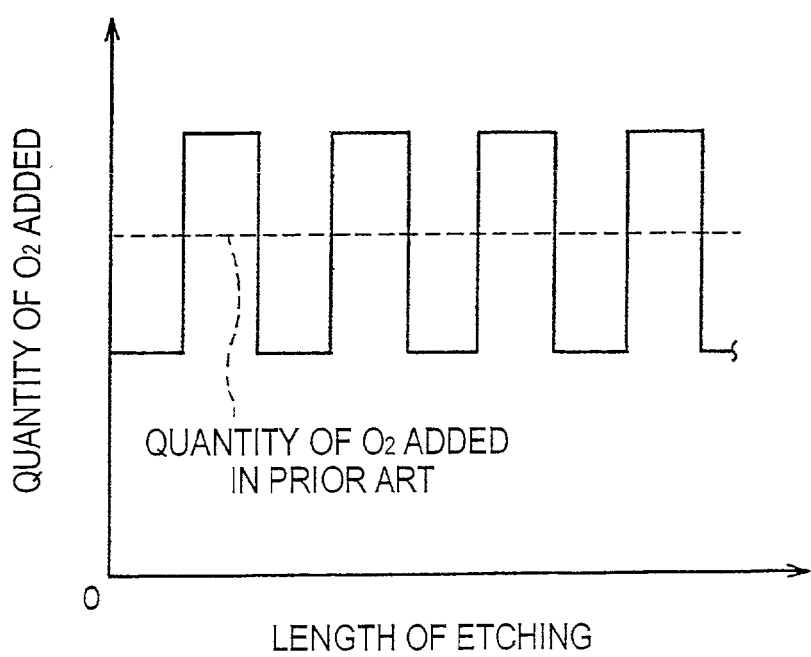
FIG. 4 schematically illustrates another structure that may be adopted in controlling the quantity of $O_2$ to be added.

Next, a specific level of high-frequency power is applied to the lower electrode 106 to generate plasma inside the process chamber 102. Once the controller 156 verifies that the plasma has stabilized as in the first embodiment explained earlier, it adjusts the degree of openness of the fourth flow-regulating valve 152. Through this adjustment, the flow rate of $O_2$ introduced into the gas diffusion chamber 130 is increased/decreased. As a result, the quantity of $O_2$ added into the process gas is increased/decreased as shown in FIG. 4. In addition, the flow rate of $O_2$ is repeatedly increased/decreased within a range of 5 sccm ($0.8333 \times 10^{-7}$ $m^3/s$ in a normal state) and 10 sccm ($1.67 \times 10^{-7}$ $m^3/s$ in a normal state). It is to be noted that the length of time over which $O_2$ is supplied into the gas diffusion chamber 130 at the high flow rate of 10 sccm ($1.67 \times 10^{-7}$ $m^3/s$ in a normal state) is set to several ms~several tens of ms, e.g., 5 ms 10 ms. The length of time over which $O_2$ is supplied into the gas diffusion chamber 130 at the low rate of 5 sccm ($0.833 \times 10^{-7}$ $m^3/s$ in a normal state) is set greater than the length of time over which $O_2$ is supplied at the high flow rate.

In the embodiment structured as described above, the quantity of $O_2$ added into the process gas is increased/decreased in a specific cycle. Thus, the $O_2$ content in the process gas is not always high. As a result, it is possible to form a contact hole 204 with a specific high aspect ratio without inducing an etch stop while maintaining the pattern formed at the photoresist film layer 206 in its initial state. In addition, $O_2$ is added into the process gas before the plasma generation as well as during and after the plasma generation in the embodiment. Consequently, the process can be implemented under conditions roughly identical to those adopted in the process in the prior art. Furthermore, $O_2$ is constantly added into the process gas during the process, and, thus, the occurrence of etch stop can be prevented with an even higher degree of reliability.

Third Embodiment

Next, a third embodiment of the present invention is explained. This embodiment is characterized in that the quantity of $O_2$ added into the process gas is adjusted in conformance to the change occurring in the composition of the plasma that corresponds to the change in the aspect ratio of the contact hole 204.

(1) Structure of Etching Device

Figure 5:
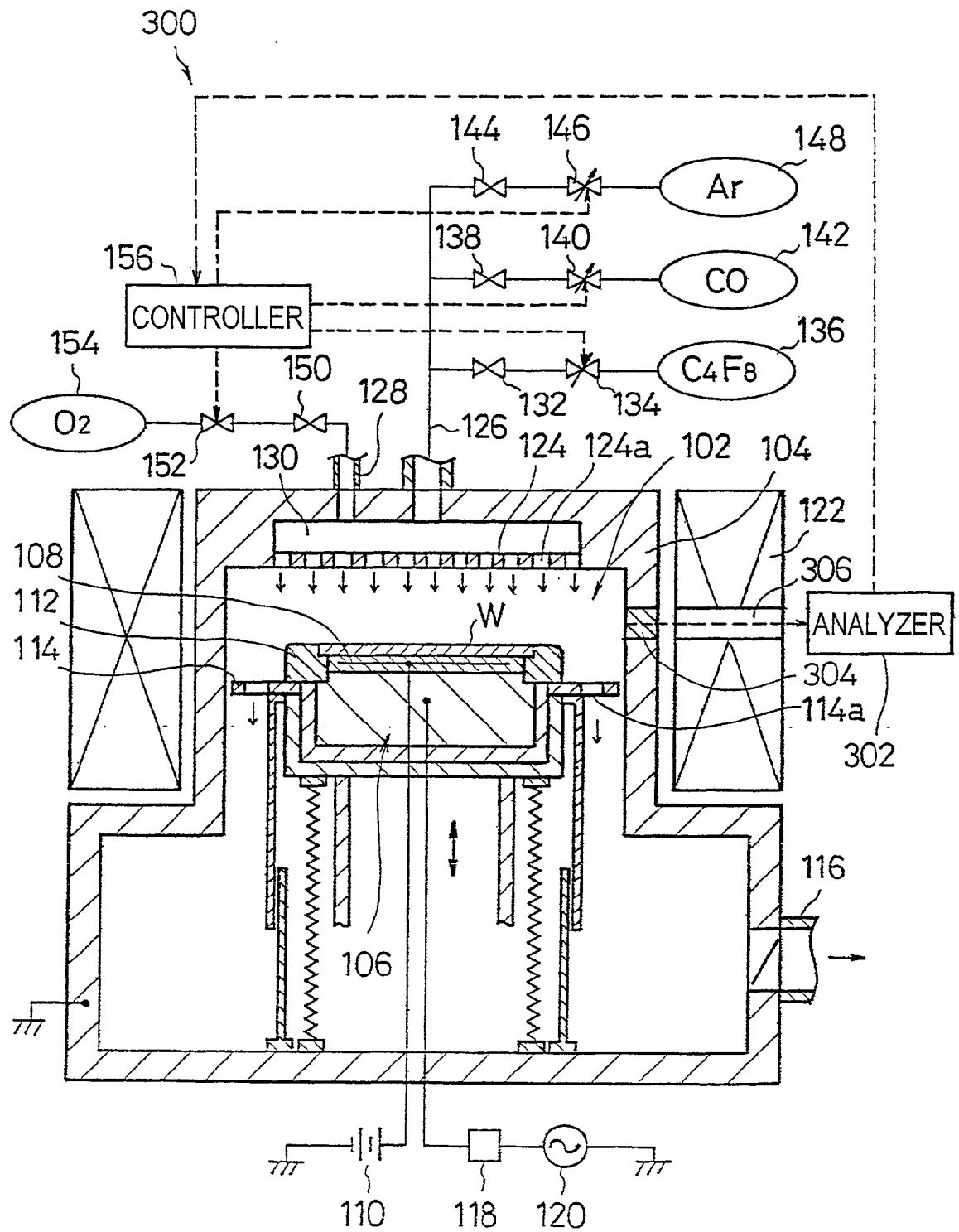
FIG. 5 is a schematic sectional view of another etching device that may adopt the present invention.

First, in reference to FIG. 5, an etching device 300 in which the embodiment may be adopted is explained. An analyzer 302 is connected to the controller 156 of the etching device 300. The analyzer 302 receives infrared laser light having been output from a light source (not shown) and passed through plasma generated inside the process chamber 102. Then, using the infrared laser light thus received, the analyzer 302 measures the change occurring in the composition of the plasma inside the process chamber 102 through, for instance, infrared laser absorption spectroscopy (IR-LAS). In addition, the infrared laser having passed through the plasma is received at a light-receiving unit of the analyzer 302 via a detection window 304 provided at the side wall of the process chamber 102 and achieving light transmissivity and a through opening 306 provided at the magnet 122. Other structural features are identical to those in the etching device 100.

(2) Relationship Between Change in Contact Hole Aspect Ratio and Change in Plasma Composition Next, in reference to FIGS. 6 and 7, the relationship between the change occurring in the aspect ratio of the contact hole 204 and the change in the plasma composition is explained.

Figure 6A:
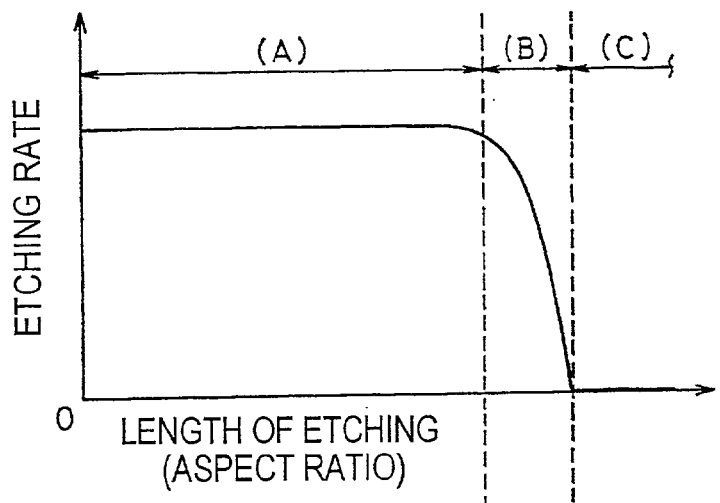
FIG. 6(a) schematically illustrates the relationship between length of the etching time (contact hole aspect ratio) and the etching rate, FIG. 6(b) schematically illustrates the relationship between the length of etching time (contact hole aspect ratio) and the quantity of reaction product and the like accumulated at the bottoms of the contact holes and FIG. 6(c) schematically illustrates the relationship between the length of etching time (contact hole aspect ratio) and the contents of the plasma component.

First, an etching process implemented on the $SiO_2$ film layer 202 of the wafer W by using a process gas constituted of $C_4F_8$, CO and Ar without any $O_2$ content is explained. As shown in FIG. 6(a), the etching rate becomes lowered when a specific length of etching time has elapsed, i.e., when the aspect ratio of the contact hole 204 formed at the $SiO_2$ film layer 202 is equal to or higher than a specific value. Ultimately, the $SiO_2$ film layer 202 can be etched no further.

Figure 7A:
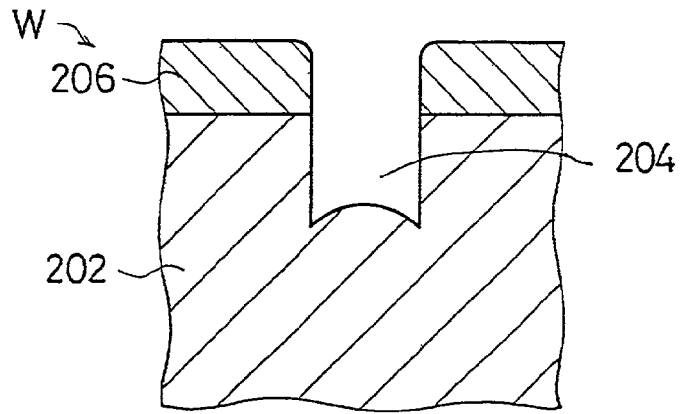
FIG. 7(a) presents a schematic sectional view of the shape of a contact hole achieved in the time segment (A) in FIGS. 6(a)~6(c)
Figure 7B:
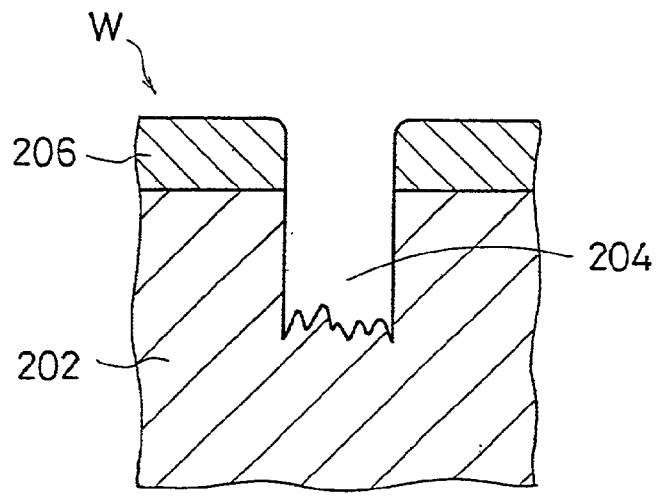
FIG. 7(b) presents a schematic sectional view of the shape of a contact hole achieved in the time segment (B) in FIGS. 6(a)~6(c) and FIG. 7(c) presents a schematic sectional view of the shape of a contact hole achieved in the time segment (C) in FIGS. 6(a)~6(c)
Figure 7C:
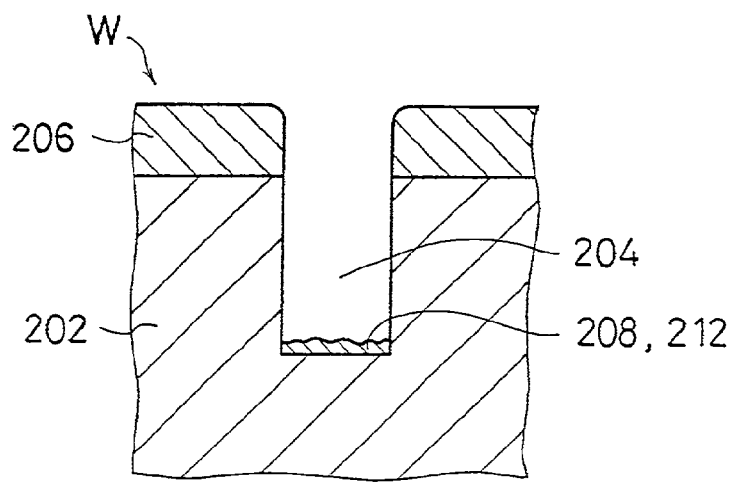

During this process, during the time segment (A) over which an essentially constant etching rate is assured, as shown in FIG. 6(a), a so-called micro-trench contact hole 204 shown in FIG. 7(a) is formed at the $SiO_2$ film layer 202. Then, as the etching process progresses to a more advanced stage, the etching state of the $SiO_2$ film layer 202 becomes unstable during the time segment (B) over which of the etching rate is lower, resulting in the bottom of the contact hole 204 becoming uneven, as shown in FIG. 7(b). Over the time segment (C) in which the etching rate is practically 0, the reaction product 208 and the deposit 212 (hereafter referred to as they "reaction product and the like 208 and 212") explained earlier become accumulated at the bottom of the contact hole 204 as shown in FIG. 7(c). Furthermore, during the time segment (C), the inner side wall of the contact hole 204 becomes charged to result in an etch stop.

Figure 6B:
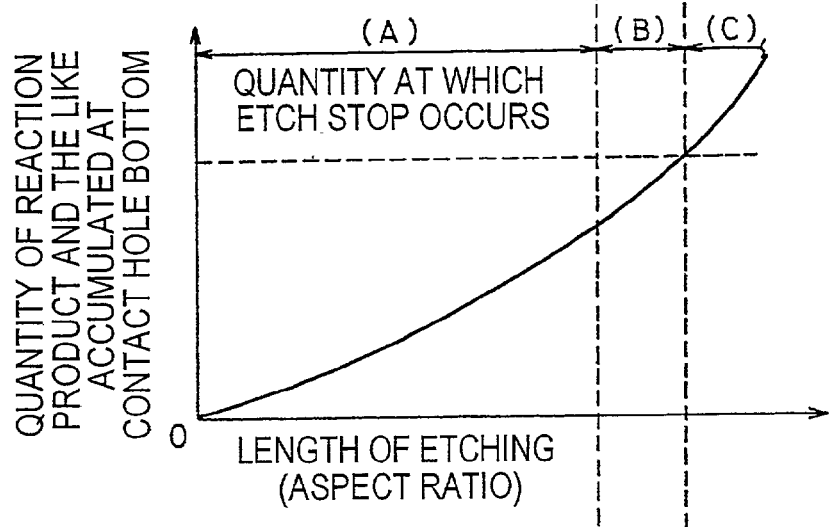

Next, the relationship between the length of etching time (aspect ratio) and the quantity of the reaction product and the like 208 and 212 accumulated at the bottom of the contact hole 204 is explained. As shown in FIG. 6(b), the reaction product and the like 208 and 212 start to accumulate at the bottom of the contact hole 204 at the initial stage of the etching process, i.e., while the aspect ratio is still low. However, as long as the quantity of accumulation remains at the level corresponding to the time segment (A), a specific type of etching process is implemented, as shown in FIG. 7(a). Once the reaction product and the like 208 and 212 become accumulated to the quantity corresponding to the time segment (B), the etching process is affected, as illustrated in FIG. 7(b). When the reaction product and the like are accumulated to the quantity corresponding to the time segment (C), i.e., to a quantity equal to or larger than the etch stop limit quantity at the boundary of the time segment (B) and the time segment (C), an etch stop occurs as shown in FIG. 7(c).

As explained above, the increase in the aspect ratio, the length of etching time, the etching rate, the etching shape and the quantity of the reaction product and the like 208 and 212 accumulated at the bottom of the contact hole 204 are closely related to one another. Accordingly, by increasing the quantity of $O_2$ added into the process gas in proportion to the increase in the aspect ratio, the occurrence of etch stop can be prevented and, at the same time, a desired etching rate and a desired etching shape can be achieved. In addition, $O_2$ is added in a small quantity during the initial stage of the process in which the aspect ratio is still low. Thus, the extent of damage to the photoresist film layer 206 and the pattern shoulders can be minimized. Furthermore, the total quantity of $O_2$ that is introduced into the process gas (the intake quantity) can be set equal to or lower than the total quantity of $O_2$ continuously introduced into the process gas in the prior art. As a result, the shoulders of the photoresist film layer 206 can be prevented from becoming ground with a high degree of reliability. Furthermore, $O_2$, which is added in a small quantity during the initial stage of the process can be replenished in larger quantities subsequently. Consequently, the occurrence of an etch stop can be prevented reliably.

Figure 6C:
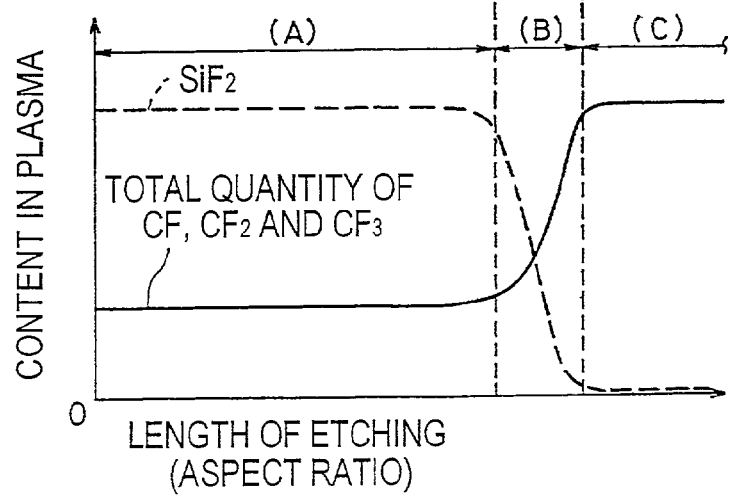

It is to be noted that it is extremely difficult to measure the aspect ratio of the contact hole 204 during the etching process. Accordingly, the quantity of $O_2$ being added is adjusted based upon the change in the plasma composition occurring as the aspect ratio increases in the embodiment. Now, the relationship between the increase in the aspect ratio and the change occurring in the plasma composition is explained. As shown in FIG. 6(c), over the time segment (A) in which the specific type of etching process described above is implemented, the total content of CF, $CF_2$ and $CF_3$ constituting the etchant in the plasma (hereafter referred to as the "content of CF and the like") remains constant. The content of $SiF_2$, which is one of the byproducts resulting from the etching process implemented on the $SiO_2$ film layer 202, is also constant. Over the time segment (B), in which the etching process does not progress as easily, the content of CF and the like increases and the content of $SiF_2$ is reduced. In the time segment (C) in which the etching process practically stops, the content of CF and the like becomes constant and the $SiF_2$ content is nearly zero.

As described above, there is a correlation among the aspect ratio of the contact hole 204, the change occurring in the etching shape, the total CF content and the $SiF_2$ content in the plasma inside the process chamber 102. Accordingly, during the actual process, the change occurring in the plasma composition should be measured to enable adjustment of the quantity of $O_2$ added into the process gas in correspondence to the change in the plasma composition. Through this measure, control roughly identical to that achieved by adjusting the quantity of $O_2$ being added into the process gas in conformance to the aspect ratio and the etching shape is realized.

Figure 8:
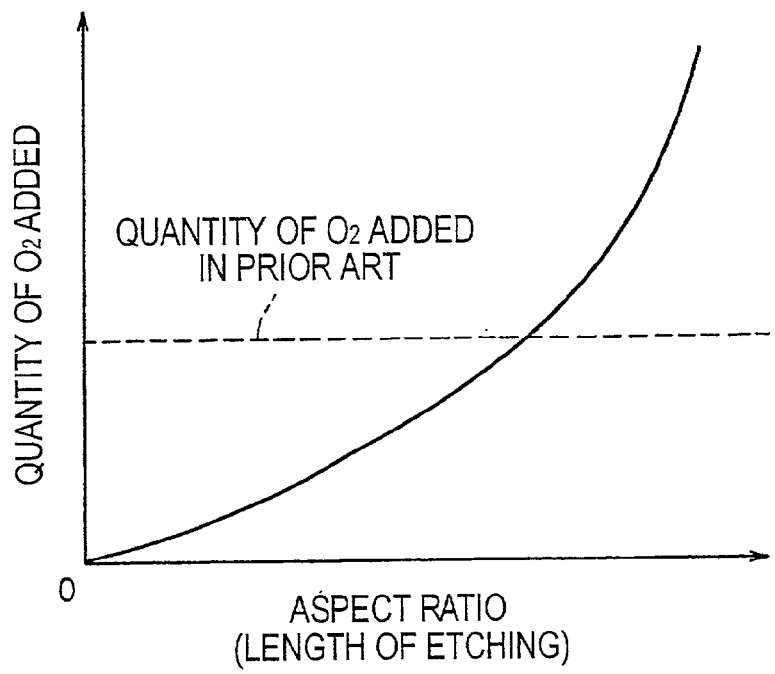
FIG. 8 schematically illustrates the structure of the control on the quantity of $O_2$ that is added, adopted in the etching device in FIG. 5.

(3) Etching step and structure adopted to implement control of the quantity of $O_2$ being added Next, in reference to FIGS. 5, 6(c) and 8, the etching step and the structure adopted to implement control the quantity of $O_2$ being added are explained. It is to be noted that procedures identical to those in the first embodiment are not explained.

Infrared laser light output from the light source (not shown) is input to the analyzer 302. As when plasma is generated inside the process chamber 102 after the start of the etching process, the infrared laser light travels through the plasma. The analyzer 302 ascertains the individual contents of CF, $CF_2$, $CF_3$ and the $SiF_2$ contained in the plasma by using infrared laser light having passed through the plasma for her infrared laser absorption spectroscopy. The analyzer 302 then outputs information indicating these contents to the controller 156.

At the controller 156, information with regard to changes occurring in the content of CF and the like and the $SiF_2$ content in the plasma as the aspect ratio increases, as shown in FIG. 6(c), is set in advance. This enables the controller 156 to adjust the flow rate of $O_2$ when the total content of CF, $CF_2$ and $CF_3$ (the content of CF and the like) and the $SiF_2$ content input from the analyzer 302 have changed. Namely, the controller 156 adjusts the flow rate of $O_2$ when the content of CF and the like has increased and the $SiF_2$ content has decreased. Through this measure, the quantity of $O_2$ being added is continuously increased essentially in proportion to the increase in the aspect ratio of the contact hole 204, as shown in FIG. 8. As a result, the quantity of $O_2$ induced toward the bottom of the contact hole 204 increases, and damage to the photoresist film layer 206 and the shoulders is prevented as a result while the occurrence of an etch stop is also prevented. Thus, a contact hole 204 achieving a high aspect ratio can be formed.

Fourth Embodiment

Next, a fourth embodiment of the present invention is explained. This embodiment is characterized in that $O_2$ is intermittently added into the process gas while intermittently applying plasma generating high-frequency power to an upper electrode 1108.

(1) Structure of Etching Device

Figure 14:
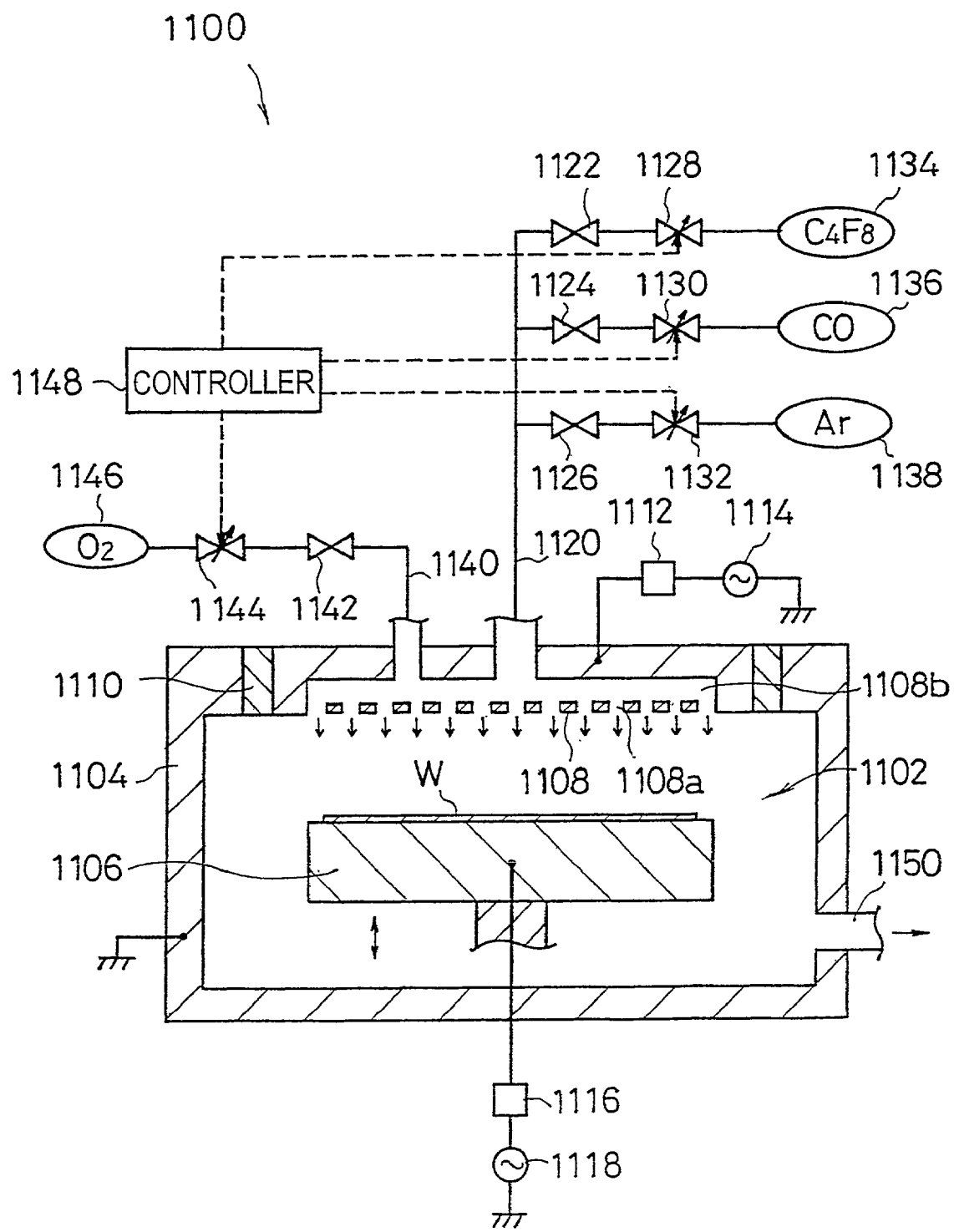
FIG. 14 is a schematic sectional view of another etching device that may adopt the present invention.

In reference to FIG. 14, the structure of an etching device 1100 in which this embodiment may be adopted is explained. A process chamber 1102 of the etching device 1100 is formed inside an electrically conductive and airtight process container 1104. A conductive upper electrode (first electrode) 1108 and a lower electrode (second electrode) 1106 are provided facing opposite each other inside the process chamber 1102. The lower electrode 1106 also functions as a stage on which a wafer W is placed. In addition, an insulating member 1110 is provided between the upper electrode 1108 and the process container 1104. A high-frequency power supply 1114 is connected to the upper electrode 1108 via a matcher 1112. The high-frequency power supply 1114 outputs plasma generating high-frequency power with a specific frequency of, for instance, 27 MHz. A high-frequency power supply 1118 is connected to the lower electrode 1106 via a matcher 1116. The high-frequency power supply 1118 outputs biasing high-frequency power with a frequency lower than the frequency of the high-frequency power applied to the upper electrode 1108, which does not include plasma generation, e.g., 800 KHz.

Numerous gas outlet holes 1108a are formed at the upper electrode 1108. First and second gas supply pipes 1120 and 1140 are connected to the gas outlet holes 1108a via a gas diffusion chamber 1108b. First~third gas supply sources 1134, 1136 and 1138 are connected to the first gas supply pipe 1120 respectively via first~third flow-regulating valves (mass flow controllers) 1128, 1130 and 1132 and switching valves 1122, 1124 and 1126. In addition, a fourth gas supply source 1146 is connected to the second gas supply pipe 1140 via a fourth flow-regulating valve 144 and a switching valve 142. A controller 1148 is connected to the first~fourth flow-regulating valves 1128, 1130, 1132 and 1144. The controller 1148 adjusts the gas flow rates by controlling the first~fourth flow-regulating valves 1128, 1130, 1132 and 1144. A vacuum pump (not shown) is connected at a lower portion of the process chamber 1102 via an evacuating pipe 1150.

(2) Etching Step

Figure 15:
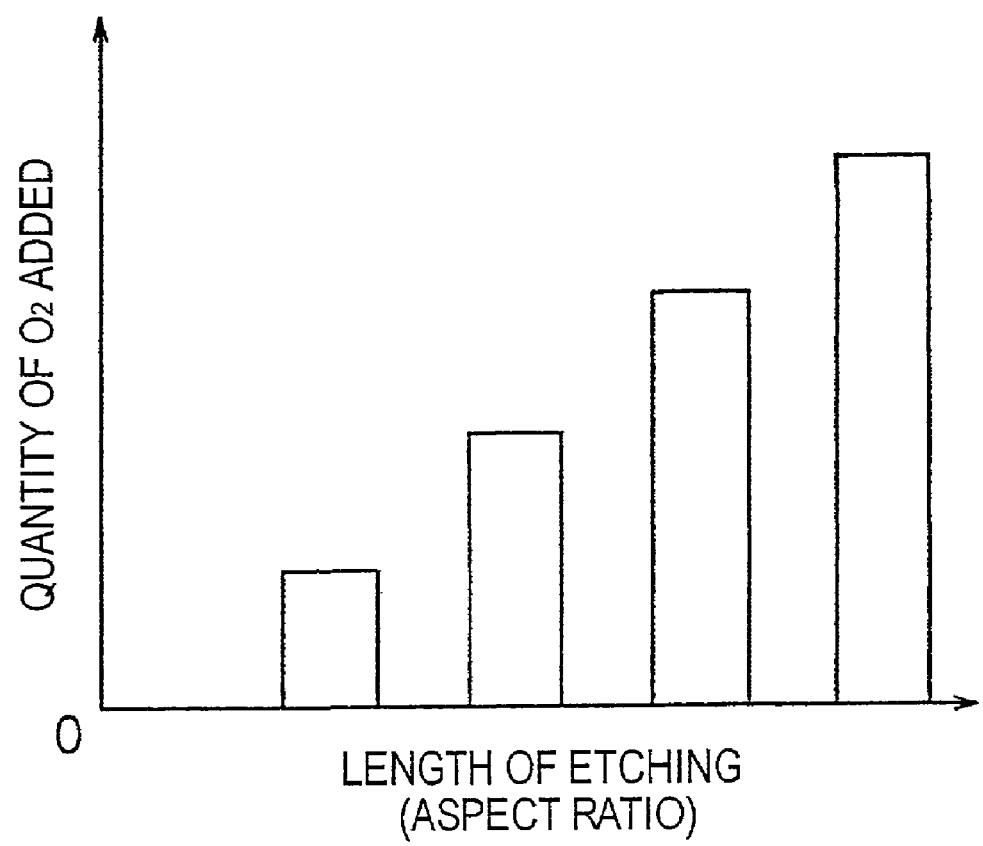
FIG. 15 schematically illustrates the structure adopted to supply $O_2$ in the etching device shown in FIG. 14.
Figure 22:
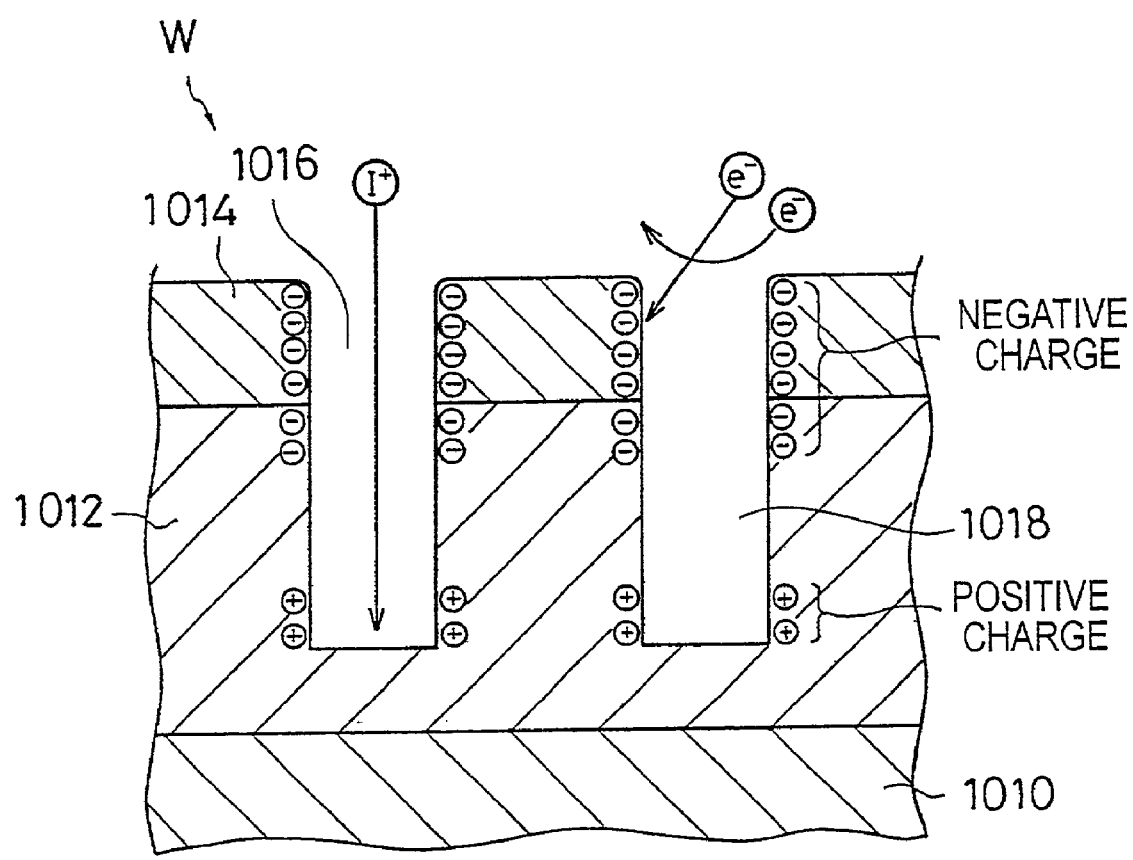
FIG. 22 schematically illustrates charging damage attributable to electron shading that occurs in an etching method in the prior art.

Next, in reference to FIGS. 14, 15 and 22, the etching step that characterizes the embodiment is explained.

First, as shown in FIG. 14, the wafer W is placed on the lower electrode 1106. At this time, the temperature of the wafer W is set at a specific level, e.g., 20° C., via the lower electrode 1106. The temperature at the inner wall surface of the process chamber 1102 and the upper electrode 1108 is set at, for instance, 60° C.

Next, the controller 1148 adjusts the first~third flow-regulating valves 1128, 1130 and 1132 as appropriate. Through this adjustment, the process gas, e.g., a mixed gas constituted of $C_4F_8$, CO and Ar is introduced into the process chamber 1102 from the first~third gas supply sources 1134, 1136 and 1138 with specific flow rates set for the individual constituents. At this time, the flow rate of $C_4F_8$ is set at, for instance, 11 sccm ($1.83 \times 10^{-7}$ m$^3$/s in a normal state), the flow rate of CO is set at, for instance, 50 sccm ($8.33 \times 10^{-7}$ m$^3$/s in a normal state) and the flow rate of Ar is set at, for instance, 200 sccm ($33.3 \times 10^{-7}$ m$^3$/s in a normal state). The fourth flow-regulating valve 1144 remains closed. Thus, $O_2$ is not supplied in this state. Concurrently, vacuum drawing is implemented inside the process chamber 1102. As a result, the pressure inside the process chamber 1102 is sustained at, for instance, 45 mTorr (6.0 Pa).

Then, high-frequency power with a frequency of, for instance, 27 MHz that repeatedly enters ON/OFF states in a specific cycle (hereafter referred to as the "pulse power") is applied to the upper electrode 1108. Through this power application, the process gas having been introduced into the process chamber 1102 is dissociated to generate plasma. In addition, continuous-wave high-frequency power having a frequency of, for instance, 800 KHz (hereafter referred to as the "biasing power") is applied to the lower electrode 1106.

This power application causes electrons, ions and radicals in the plasma to be drawn into the wafer W. As a result, contact holes 1018 are formed at an $SiO_2$ film layer 1012 of the wafer W, as shown in FIG. 22.

The state of the plasma generation is monitored by a sensor (not shown). The sensor monitors the state of the plasma generation by detecting the emission spectrum of the plasma, for instance. The information obtained at the sensor is communicated to the controller 1148. Once the controller 1148 judges that the plasma has stabilized and a stable etching process is being implemented on the $SiO_2$ film layer 1012, it applies a specific level of pulse voltage to the fourth flow-regulating valve 1144. While the pulse voltage application is on, the fourth flow-regulating valve 1144 is open to allow the $O_2$ from the fourth gas supply source 1146 to be supplied into the gas diffusion chamber 1108b. While the pulse voltage is off, on the other hand, the fourth flow-regulating valve 1146 is closed and the supply of $O_2$ is stopped. As a result, $O_2$ is added into the process gas present inside the gas diffusion chamber 1108b in synchronization with the ON/OFF of the pulse voltage application. The process gas is supplied into the process chamber 1102 via the gas outlet holes 1108a.

The quantity of $O_2$ added into the process gas (the $O_2$ flow rate) is increased as the processing time lengthens, i.e., in proportion to the increase in the aspect ratio of the contact holes 1018 occurring as the etching process progresses, as shown in FIG. 15. The change occurring in the aspect ratio is ascertained, in conformance to the length of etching time that has elapsed, by the controller 1148 based upon the corresponding relationship between the length of etching time and the increase in the aspect ratio determined in advance. When this measure is adopted, the quantity of $O_2$ added into the process gas is small during the initial stage of the process in which the aspect ratio is low. As a result, the photoresist film layer 1014 and the shoulders of a pattern 1016 are not ground readily. For this reason, the $SiO_2$ film layer 1012 is etched in an optimal manner based upon the specific pattern 1016. In addition, the total quantity of $O_2$ introduced into the process gas (the $O_2$ intake quantity) can be set equal to or lower than the total $O_2$ induction quantity required when $O_2$ is continuously induced into the process gas. Thus, the shoulders at the photoresist film layer 1014 are prevented from becoming a ground with a high degree of reliability. The quantity of $O_2$ added into the process gas is increased as the aspect ratio becomes higher. As a result, charging damage is reliably prevented.

The length of time over which $O_2$ is added per cycle is set at several ms~several tens of ms, e.g., 5 ms~10 ms. The length of time over which $O_2$ is not supplied is set larger than the length of time over which $O_2$ is added. Thus, $O_2$ is supplied over a shorter length of time than that over which $O_2$ is not supplied. Consequently, $O_2$ can be added into the process gas in a quantity at which the photoresist film layer 1014 and the like would be damaged if $O_2$ was added constantly. Thus, the photoresist film layer 1014 and the shoulders of the pattern 1016 essentially do not become damaged.

(3) How Charging Damage is Prevented

Figure 16:
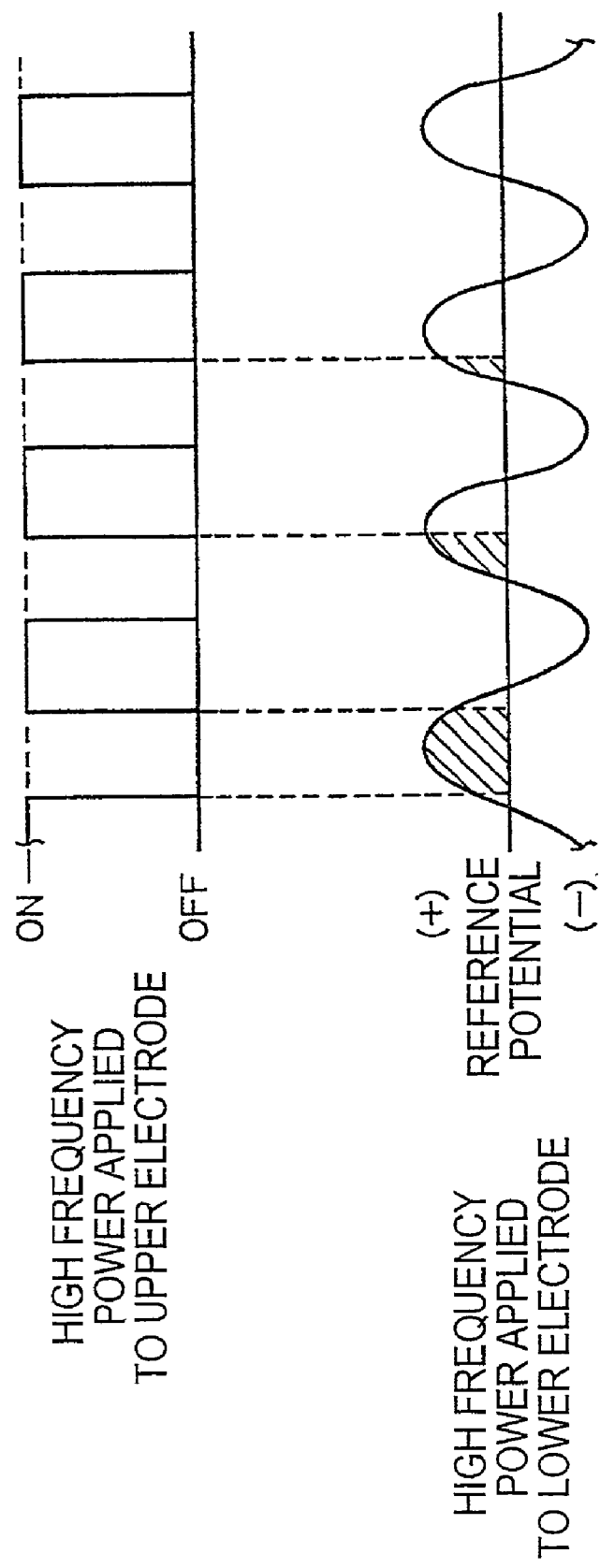
FIG. 16 schematically illustrates how charging damage is eliminated.
Figure 17:
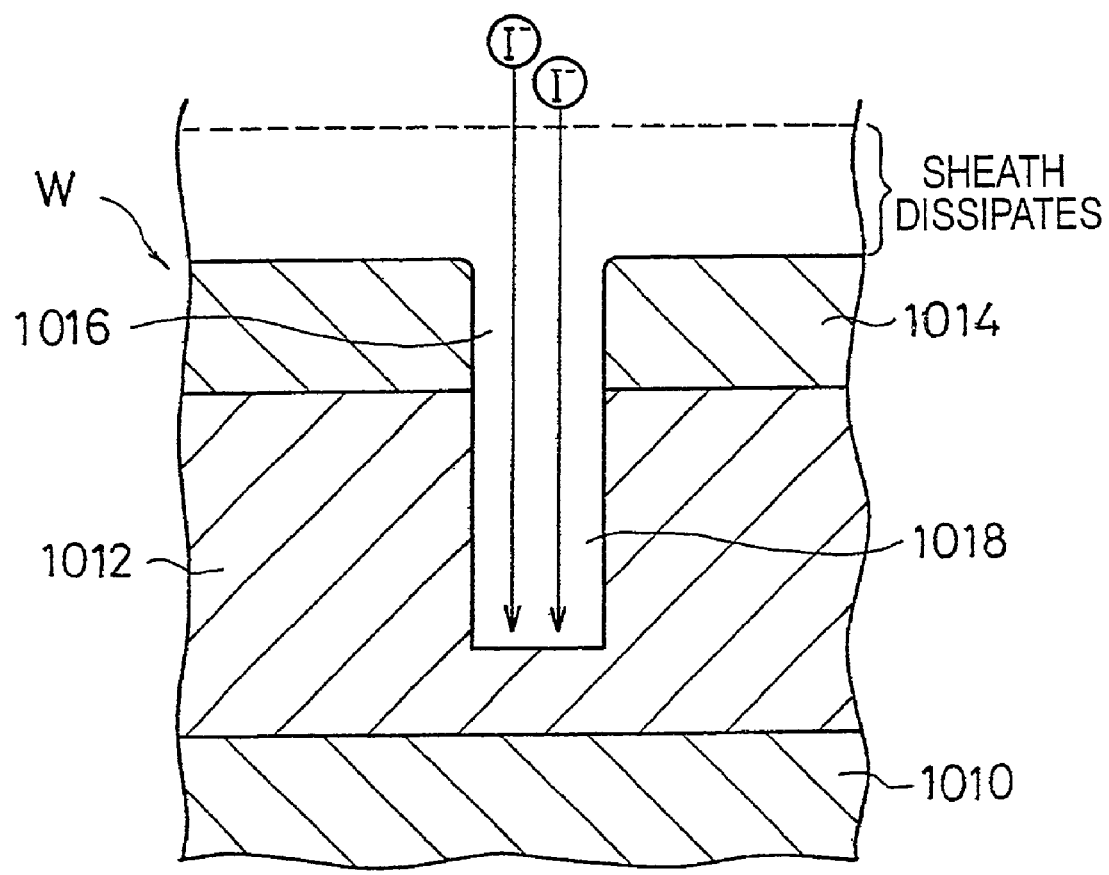
FIG. 17 schematically illustrates how charging damage is eliminated.

Next, in reference to FIGS. 16 and 17, an explanation is given on how the problem of charging damage can be eliminated by adding $O_2$.

As shown in FIG. 16, the pulse power and the biasing power are respectively applied to the upper electrode 1108 and the lower electrode 1106 during the process. $O_2$ added into process gas becomes dissociated together with $C_4F_8$ and the like while the pulse power is on, and thus, positive ions, negative ions, radicals and electrons are generated. Among these, negative ions or electrons of oxygen that eliminate the positive charge stored at the lower areas of the contact holes 1018 are drawn into the contact holes 1018 while the pulse power is turned off and the biasing power is in a positive cycle (the periods corresponding to the shaded areas in FIG. 16).

In other words, the negative ions of oxygen cannot pass through the sheath formed between the wafer W and the plasma if the pulse power is in an ON state even when the biasing power is a positive cycle. As a result, the negative ions of oxygen cannot reach inside the contact holes 1018 while the pulse power is in an ON state.

However, once the pulse power is turned off, the sheath becomes dissipated, as shown in FIG. 17. The dissipation of the sheath allows the negative ions ($I^-$) and electrons of oxygen to be drawn into each contact hole 1018 and ultimately to reach the bottom of the contact hole 1018 when the biasing power is in a positive cycle. As a result, the positive charge stored at the lower wall of the contact hole 1018 becomes electrically neutralized by the negative ions and electrons of oxygen, thereby eliminating the charge. Thus, positive ions (the etching seed) dissociated from $C_4F_8$ is allowed to enter the contact hole 1018 along a direction perpendicular to the bottom surface of the contact hole 1018 even if the aspect ratio of the contact hole 1018 has become high, which, in turn, makes it possible to form the contact hole 1018 in a specific shape.

In the embodiment structured as described above, the supply of $O_2$ added into the process gas is switched ON/OFF in a specific cycle and the quantity of $O_2$ added into the process gas is increased in proportion to the increase in the aspect ratio. Thus, the problem of the lower wall of the contact hole 1018 becoming charged can be eliminated while maintaining the pattern of the 1016 in its initial state, so that a contact hole 1018 achieving a desired high aspect ratio is formed.

Fifth Embodiment

Next, a fifth embodiment of the present invention is explained. This embodiment is characterized in that the quantity of $O_2$ added into the process gas is increased/decreased in relative measure while intermittently applying plasma generating high-frequency power to the upper electrode 1108.

Figure 18:
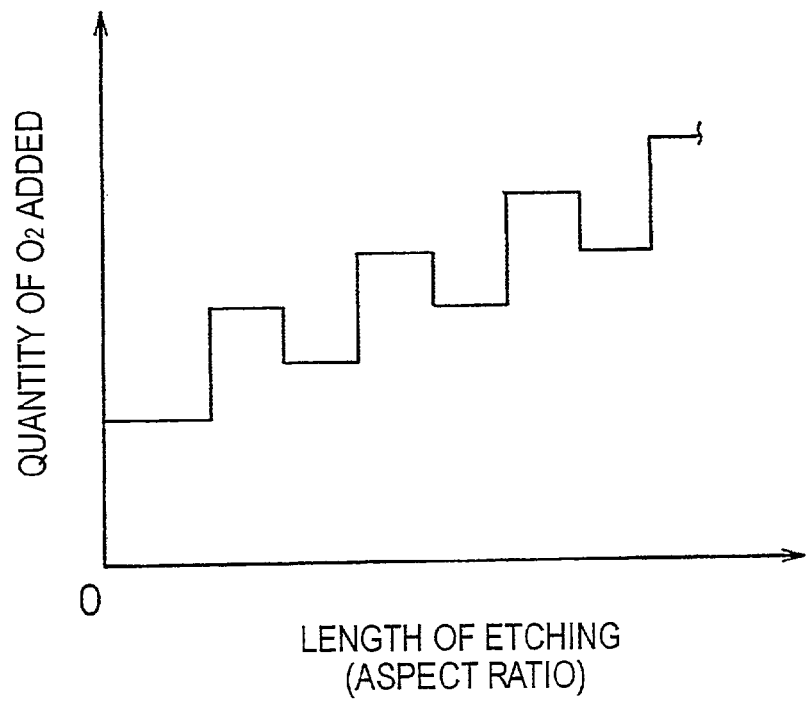
FIG. 18 schematically illustrates another structure that may be adopted to supply $O_2$.

Namely, a process gas containing $O_2$ added at a flow rate of, for instance, 5 sccm ($0.833 \times 10^{-7}$ $m^3$/s in a normal state) is supplied into the process chamber 1102 prior to the start of the process. Then, after specific processing conditions are achieved, the high-frequency power mentioned earlier is applied to the upper electrode 1108 and the lower electrode 1106 to implement an etching process on the wafer W. Once the controller 1148 verifies that the plasma has stabilized, it adjusts the degree of openness of the fourth flow-regulating valve 1144 in correspondence to the length of processing time that has elapsed, i.e., in proportion to the increase in the aspect ratio of the contact hole 1018. Through this adjustment, the flow rate of $O_2$ introduced into the gas diffusion chamber 1108b is cyclically increased/decreased. Through this measure, the quantity of $O_2$ added into the process gas is increased in stages in proportion to the increase in the aspect ratio, as shown in FIG. 18. It is to be noted that the length of time over which $O_2$ is supplied into the gas diffusion chamber 1108b at a high flow rate is set at several ms~several tens of ms, e.g., 5 ms~10 ms. The length of time over which $O_2$ is supplied into the gas diffusion chamber 1108*b* at a low flow rate, on the other hand, is set larger than the length of time over which $O_2$ is supplied at the high flow rate. It is to be noted that other structural features are identical to those adopted in the fourth embodiment.

In the embodiment structured as described above, $O_2$ is constantly added into the process gas during the process. Thus, negative ions of oxygen can be generated in greater quantity so that the occurrence of charging is prevented with greater reliability. In addition, the quantity of $O_2$ added into the process gas, which is increased/decreased through the adjustment, is increased as the aspect ratio becomes higher. As a result, the extent of damage to the photoresist film layer 1014 and the shoulders of the pattern 1016 attributable to the addition of $O_2$ can be minimized.

Sixth Embodiment

A sixth embodiment of the present invention is now explained. This embodiment is characterized in that the quantity of $O_2$ added into the process gas is continuously increased while intermittently applying the plasma generating high-frequency power to the upper electrode 1108.

Figure 19:
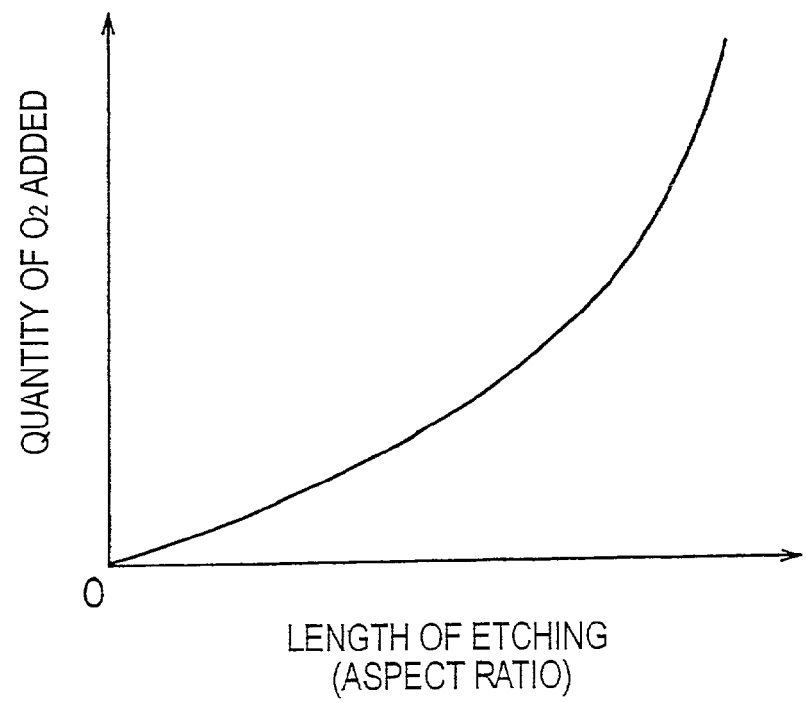
FIG. 19 schematically illustrates yet another structure that may be adopted to supply $O_2$.

Namely, a process gas which does not contain $O_2$ is introduced into the process chamber 1102. Then, plasma is generated after the various conditions mentioned earlier have been achieved to implement an etching process on the wafer W. Once the controller 1148 verifies that the plasma has stabilized, it increases the level of the voltage applied to the fourth flow-regulating valve 1144 in proportion to the increase in the aspect ratio of the contact hole 1018. Thus, as shown in FIG. 19, the quantity of $O_2$ added into the process gas is continuously increased in proportion to the increase in the aspect ratio. It is to be noted that other structural features are identical to those adopted in the fourth embodiment.

In the embodiment structured as described above, the quantity of $O_2$ added into the process gas is continuously increased as the aspect ratio becomes higher. Consequently, charging damage is prevented with greater reliability. Furthermore, the total quantity of $O_2$ added into the process gas never exceeds the quantity required to prevent the occurrence of charging damage, so that the shoulders of the photoresist film layer 1014 are more effectively prevented from becoming ground.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

Figure 9:
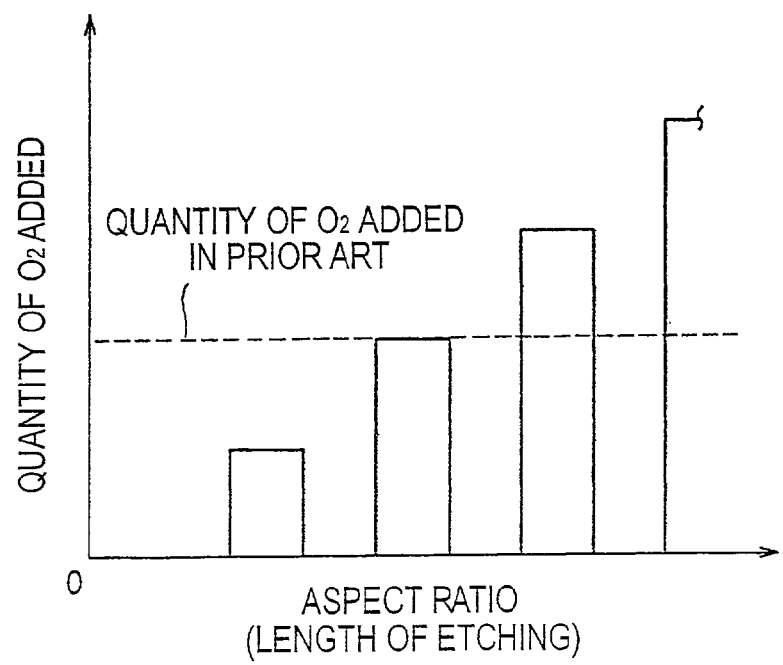
FIG. 9 schematically illustrates another structure that may be adopted in controlling the quantity of $O_2$ added.
Figure 10:
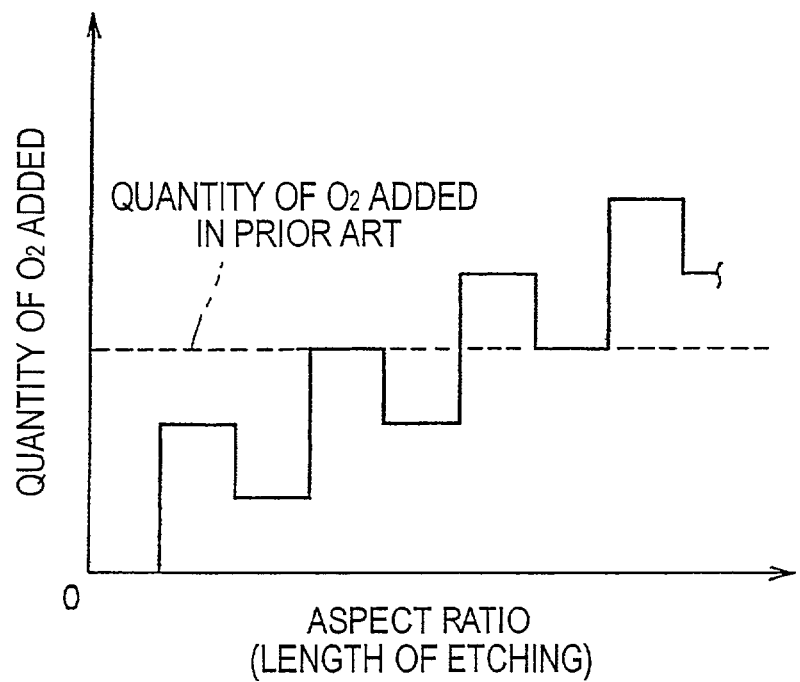
FIG. 10 schematically illustrates yet another structure that may be adopted in controlling the quantity of $O_2$ added.
Figure 11:
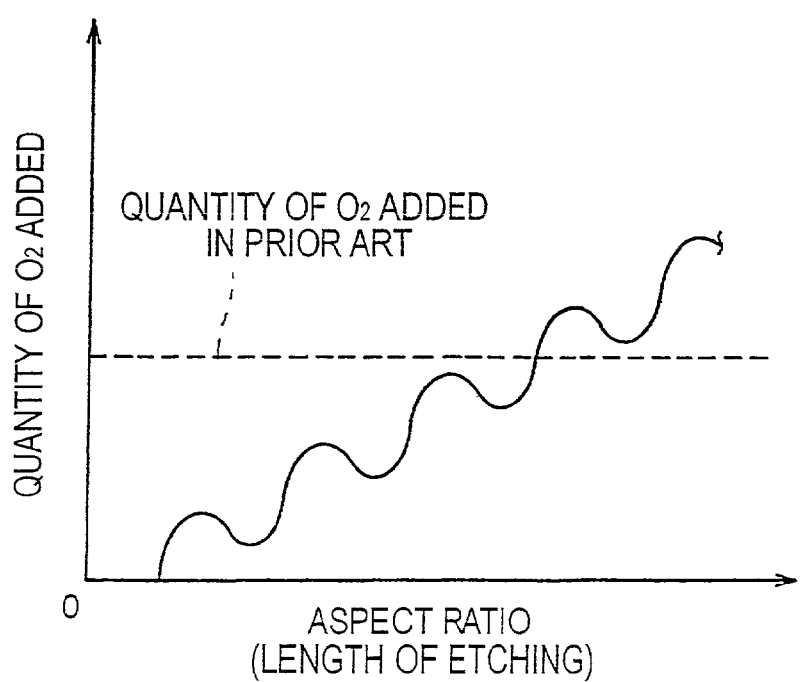
FIG. 11 schematically illustrates yet another structure that may be adopted in controlling the quantity of $O_2$ added.
Figure 13:
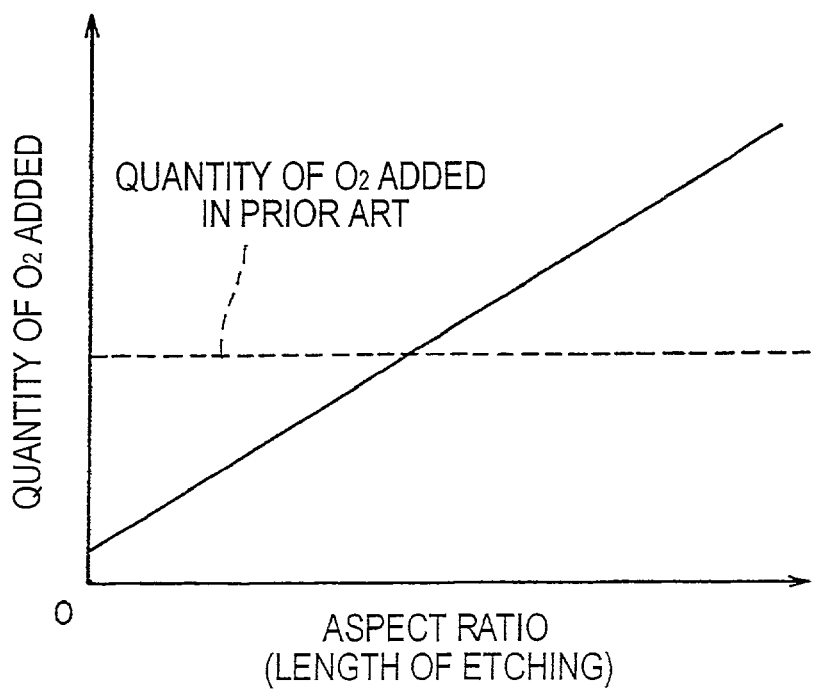
FIG. 13 schematically illustrates yet another structure that may be adopted in controlling the quantity of $O_2$ added.

For instance, while an explanation is given above in reference to the first and second embodiments on an example in which a constant quantity of $O_2$ is added into the process gas intermittently or $O_2$ is added into the process gas by increasing/decreasing the quantity, in a specific cycle, the present invention is not restricted by these details. As in the third embodiment, $O_2$ may be added intermittently (in pulses) as shown in FIG. 9 while increasing the quantity of $O_2$ added into the process gas is increased in proportion to the increase in the aspect ratio, i.e., in correspondence to the change occurring in the plasma composition, instead. Alternatively, $O_2$ may be added by increasing/decreasing its quantity in pulses, as shown in FIG. 10. Or, the quantity of $O_2$ added into the process gas may be increased/decreased along a curve, as shown in FIG. 11. Any of such alternative measures achieves advantages similar to those realized in the third embodiment. Furthermore, by continuously and linearly increasing the quantity of $O_2$ added into the process gas, as shown in FIG. 13, in correspondence to the change in the plasma composition, advantages similar to those explained above are achieved as well.

Figure 12:
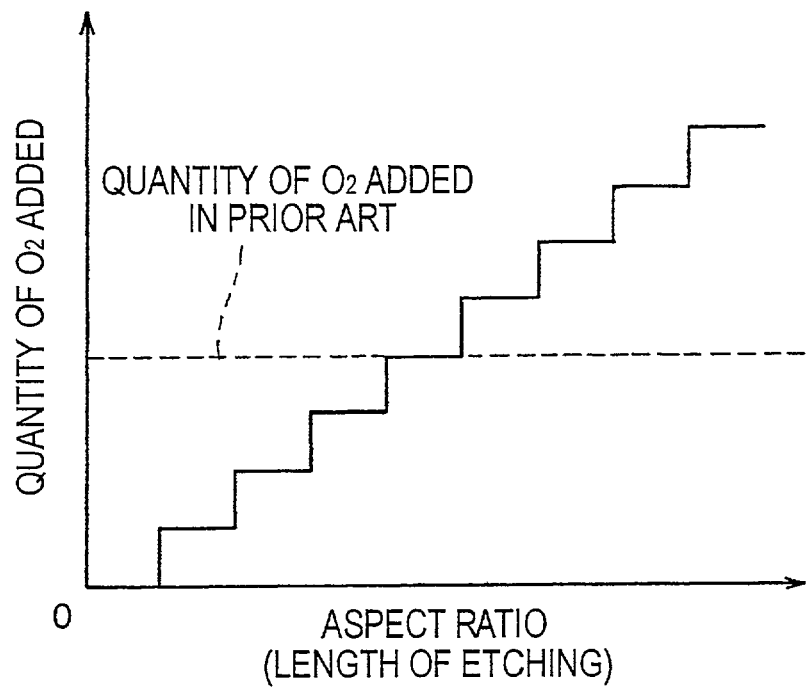
FIG. 12 schematically illustrates yet another structure that may be adopted in controlling the quantity of $O_2$ added.

In addition, while an explanation is given above in reference to the third embodiment on an example in which the quantity of $O_2$ added into the process gas is continuously increased, the present invention is not restricted by such details. For instance, by increasing the quantity of $O_2$ added in stages (multiple stages) in correspondence to the change occurring in the plasma composition as shown in FIG. 12, advantages similar to those described above are achieved.

While an explanation is given above in reference to the third embodiment on an example in which the quantity of $O_2$ added into the process gas is adjusted in conformance to the change occurring in the plasma composition, the present invention is not restricted by these details. Namely, the flow rate of a process gas constituent other than $O_2$, the pressure inside the process chamber, the high-frequency power applied to the electrodes, the temperatures at the electrodes and the inner wall of the process chamber and the like, too, may be adjusted in correspondence to the change in the plasma composition.

While an explanation is given above in reference to the third embodiment on an example in which the change in the plasma composition is measured through infrared laser absorption analysis, the present invention is not restricted by such details. For instance, the present invention may also be implemented based upon a plasma constituent contents ascertained by using laser-induced fluorescent light (LIF) or through emission spectroscopy (OES), quadrupole mass spectrometry or the like. Furthermore, the quantity of $O_2$ added into the process gas may be adjusted based upon the change occurring in the potential or the temperature of the plasma.

While an explanation is given above in reference to the third embodiment on an example in which the quantity of $O_2$ added into the process gas is adjusted in correspondence to the change occurring in the plasma composition which is ascertained through actual measurement, the present invention is not restricted by these details. The present invention may instead be implemented by ascertaining in advance the relationship between the increase in the aspect ratio of the contact hole and the length of the etching time and increasing the quantity of $O_2$ added as the etching process lengthens.

While an explanation is given above in reference to the first~third embodiments on an example in which the present invention is adopted in an etching device in which high-frequency power is applied to the lower electrode, the present invention is not restricted by such structural details. For instance, the present invention may be adopted in a plasma processing device assuming a structure in which high-frequency power is applied to both the upper electrode and the lower electrode or only to the upper electrode, as well. In addition, the present invention may be adopted in a plasma processing device that is not provided with a magnet as well as in an etching device provided with a magnet, as described earlier.

While an explanation is given in reference to the fourth sixth embodiments on an example in which the extent of an increase in the aspect ratio of the contact hole is judged in correspondence to the length of etching time that has elapsed, the present invention is not restricted by such details. For instance, the relationship between the change in the plasma composition inside the process chamber and the increase in the aspect ratio may be ascertained in advance. Then, the extent of the increase in the aspect ratio may be judged in correspondence to the change in the plasma composition ascertained through measurement during the process.

Figure 20:
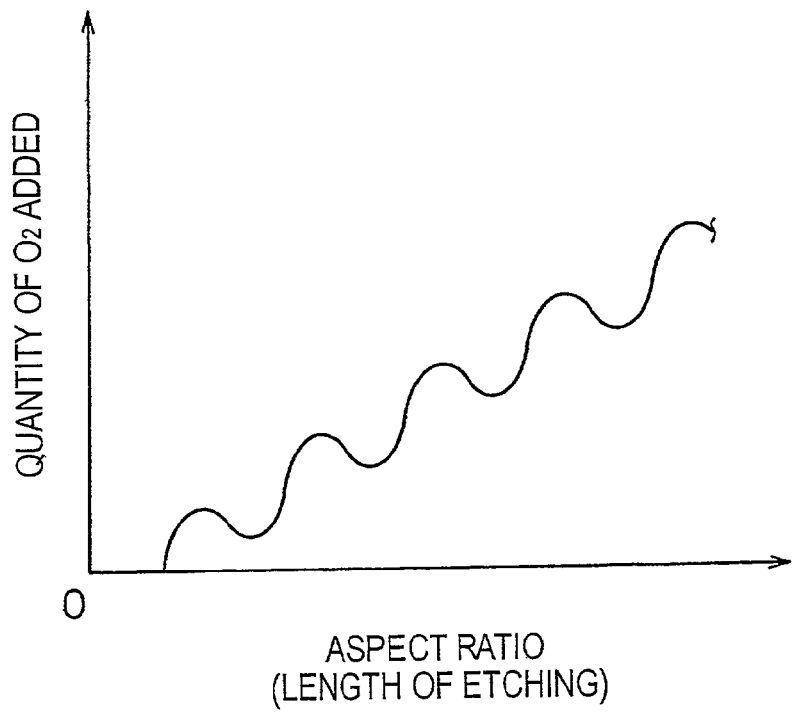
FIG. 20 schematically illustrates yet another structure that may be adopted to supply $O_2$.
Figure 21:
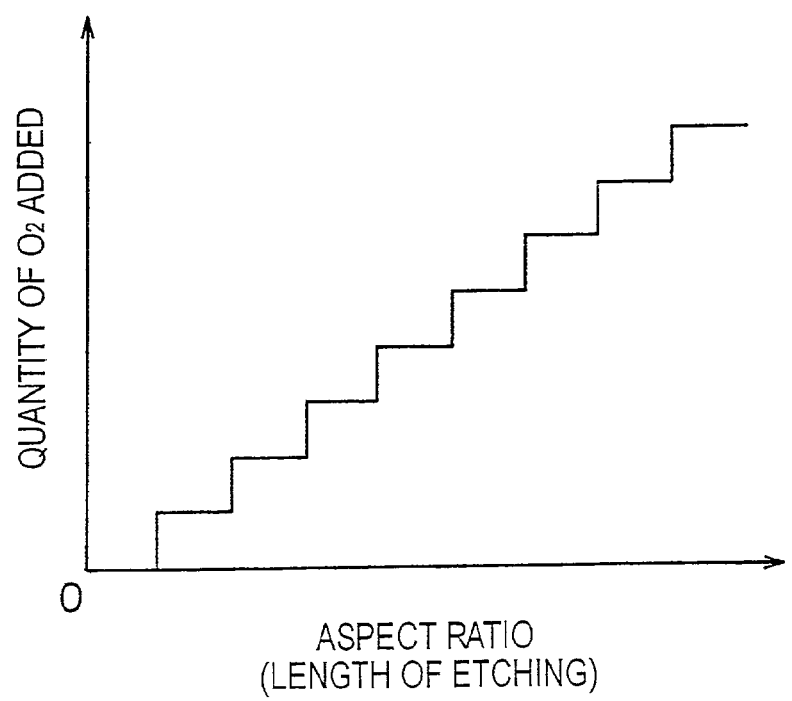
FIG. 21 schematically illustrates yet another structure that may be adopted to supply $O_2$.

While an explanation is given above in reference to the fourth ~sixth embodiments on an example in which a constant quantity of $O_2$ is added intermittently into the process gas or $O_2$ is added into the process gas by increasing/decreasing the quantity, in a specific cycle in correspondence to the increase in the aspect ratio, the present invention is not restricted by these details. For instance, when increasing the quantity of $O_2$ added into the process gas in proportion to the increase in the aspect ratio, the quantity may be adjusted along a curve, as shown in FIG. 20. Alternatively, the quantity may be increased in stages (multiple stages) as shown in FIG. 21. By adopting any of these measures, advantages similar to those realized in the embodiments are achieved.

While an explanation is given above in reference to the fourth ~sixth embodiments on an example in which the supply of $O_2$ is switched ON/OFF or the quantity of $O_2$ added into the process gas is increased/decreased after the plasma is stabilized, the present invention is not restricted by these details. For instance, the supply of $O_2$ may be switched ON/OFF immediately before the charging damage actually occurs. Alternatively, the quantity of $O_2$ added into the process gas may be increased/decreased or may be simply increased. The present invention may be adopted in conjunction with any of these measures.

In addition, while an explanation is given in reference to the first~sixth embodiments on an example in which $O_2$ is added into a mixed process gas containing $C_4F_8$, CO and Ar, the present invention is not restricted by these details, and it may be implemented by adding $O_2$ into another process gas as long as the process gas contains, at least, fluorocarbon.

While an explanation is given above in reference to the first~sixth embodiments on an example in which $O_2$ is added into the process gas in the gas diffusion chamber, the present invention is not restricted by these details and it may be adopted when $O_2$ is directly supplied into the process chamber as well.

While an explanation is given above in reference to the first~sixth embodiments on an example in which the flow rate of $O_2$ (the quantity of $O_2$ that is added) is adjusted with the flow-regulating valve which adjusts the degree of openness in correspondence to the voltage applied thereto, the present invention is not restricted by these details and it may be implemented in conjunction with another means for supply quantity adjustment as long as the flow rate of $O_2$ is adjusted.

While an explanation is given above in reference to the first~sixth embodiments on an example in which the state of the plasma is detected by employing an optical sensor, the present invention is not restricted by these details. The present invention may be implemented by ascertaining the point in time at which the plasma becomes stabilized in advance and implementing control on the $O_2$ supply quantity based upon the time point during the actual process, instead.

While an explanation is given above in reference to the fourth ~sixth embodiments on an example in which high-frequency power is intermittently applied to the upper electrode and continuous wave high-frequency power is applied to the lower electrode, the present invention is not restricted by these details and it may also be complemented by, for instance, applying the two types of high-frequency power to a second electrode on which the workpiece is placed. In addition, the present invention may be adopted in a plasma processing device in which a magnetic field is formed inside the process chamber.

According to the present invention, the process is implemented while intermittently adding $O_2$ into the process gas or while increasing/reducing in relative measure the quantity of $O_2$ added into the process gas. As a result, the extent of damage to the etching mask can be minimized. Furthermore, the reaction product accumulated at the bottoms of the contact holes is removed and thus the occurrence of the charging phenomenon at the inner wall surface of the contact hole is prevented, to effectively prevent etch stop from occurring. Consequently, an extremely small contact holes achieving a high aspect ratio and a desired shape can be formed. Also, the process can be implemented while increasing the quantity of $O_2$ added into the process gas in proportion to the increase in the aspect ratio. Therefore, the occurrence of etch stop is prevented even more reliably. Since the total quantity of $O_2$ intake is reduced, the etching mask is not damaged.

In addition, according to the present invention, negative ions of oxygen are guided toward the bottoms of the contact holes. Thus, even when forming contact holes with a high aspect ratio with high-density plasma, contact holes are not positively charged at their lower walls. Consequently, a contact hole achieving a desired shape is formed.

INDUSTRIAL ACCEPTABILITY

The present invention may be adopted in a semiconductor manufacturing apparatus and more specifically, it may be adopted in a plasma processing device such as an etching device.

The invention claimed is:

1. A plasma processing method for implementing a plasma process on a silicon oxide film layer formed at a workpiece placed inside a process chamber by generating plasma from a process gas containing, at least, fluorocarbon introduced into said process chamber, wherein;
   oxygen is intermittently added into the process gas,
   the length of time over which the oxygen is added into the process gas is less than the length of time over which the oxygen is not added into the process gas, and
   the fluorocarbon is continuously introduced into the process chamber during the plasma process.

2. A plasma processing method according to claim 1, wherein;
   the oxygen is cyclically added into the process gas.

3. A plasma processing method according to claim 1, wherein;
   the oxygen is added after the plasma has stabilized.

4. A plasma processing method for implementing a plasma process on a silicon oxide film layer formed at a workpiece placed inside a process chamber by generating plasma from a process gas containing, at least, fluorocarbon introduced into said process chamber, wherein;
   oxygen is added into the process gas and the oxygen added into the process gas is increased and decreased in relative measure,
   the length of time over which the oxygen added into the process gas is increased is less than the length of time over which the oxygen, added is decreased, and
   the fluorocarbon is continuously introduced into the process chamber during the plasma process.

5. A plasma processing method according to claim 4, wherein;

the oxygen added into the process gas is increased and decreased cyclicly.

6. A plasma processing method for implementing a plasma process on a silicon oxide film layer formed at a workpiece placed inside a process chamber by generating plasma from a process gas containing, at least, fluorocarbon introduced into said process chamber, wherein;
oxygen is added into the process gas and the oxygen added into the process gas is increased in proportion to an increase in an aspect ratio of a contact hole formed at said silicon oxide film layer, and
the fluorocarbon is continuously introduced into the process chamber during the plasma process.

7. A plasma processing method according to claim 6, wherein;
the relationship between a change occurring in the aspect ratio and a change occurring in the plasma composition is ascertained in advance and the oxygen added into the process gas is adjusted in proportion to the change in the plasma composition.

8. A plasma processing method according to claim 6, wherein;
the oxygen added into the process gas is continuously increased.

9. A plasma processing method according to claim 6, wherein;
the oxygen added into the process gas is increased in stages.

10. A plasma processing method for implementing a plasma process on a silicon oxide film layer formed at a workpiece placed on a second electrode by introducing a process gas containing, at least, fluorocarbon into a process chamber, applying high-frequency power to a first electrode and said second electrode facing opposite each other inside said process chamber and thus raising the process gas to plasma, wherein;
the frequency of the high-frequency power applied to said second electrode is lower than the frequency of the high-frequency power applied to said first electrode;
the high-frequency power is intermittently applied to said first electrode;
oxygen is intermittently added into the process gas;
a contact hole is formed at said silicon oxide film layer;
the quantity of oxygen added into the process gas is increased in proportion to an increase in the aspect ratio of said contact hole, and
the fluorocarbon is continuously introduced into the process chamber during the plasma process.

11. A plasma processing method according to claim 10, wherein;
the oxygen is cyclically added into the process gas.

12. A plasma processing method for implementing a plasma process on a silicon oxide film layer formed at a workpiece placed on a second electrode by introducing a process gas containing, at least, fluorocarbon and oxygen into a process chamber, applying high-frequency power to a first electrode and said second electrode facing opposite each other inside said process chamber and thus raising the process gas to plasma, wherein;
the frequency of the high-frequency power applied to said second electrode is lower than the frequency of the high-frequency power applied to said first electrode;
the high-frequency power is intermittently applied to said first electrode;
said plasma process is implemented while increasing the oxygen added into the process gas and while decreasing the oxygen added into the process gas, and
the fluorocarbon is continuously introduced into the process chamber during the plasma process.

13. A plasma processing method for implementing a plasma process on a silicon oxide film layer formed at a workpiece placed on a second electrode by introducing a process gas containing, at least, fluorocarbon and oxygen into a process chamber, applying high-frequency power to a first electrode and said second electrode facing opposite each other inside said process chamber and thus raising the process gas to plasma, wherein;
the frequency of the high-frequency power applied to said second electrode is lower than the frequency of the high-frequency power applied to said first electrode;
the high-frequency power is intermittently applied to said first electrode;
said plasma process is implemented while increasing the oxygen added into the process gas, and
the fluorocarbon is continuously introduced into the process chamber during the plasma process.

14. A plasma processing method according to claim 13, wherein;
a contact hole is formed at said silicon oxide film layer; and
the oxygen added into the process gas is increased in proportion to an increase in an aspect ratio of said contact hole.

15. A plasma processing method for implementing a plasma process on a silicon oxide film layer formed at a workpiece placed inside a process chamber by generating plasma from a process gas containing, at least, fluorocarbon introduced into said process chamber,
wherein oxygen is intermittently added into the process gas,
wherein a contact hole is formed at said silicon oxide film layer,
wherein the oxygen added into the process gas is increased in proportion to an increase in an aspect ratio of said contact hole, and
the fluorocarbon is continuously introduced into the process chamber during the plasma process.

16. The plasma processing method according to claim 15, wherein the oxygen is cyclically added into the process gas.

17. The plasma processing method according to claim 15, wherein the oxygen is added after the plasma has stabilized.

18. The plasma process method according to claim 15, wherein;
a relationship between a change occurring in the aspect ratio and a change occurring in the plasma is ascertained in advance and the oxygen added into the process gas is adjusted in conformance to the change in the plasma.

19. A plasma processing method according to claim 6, wherein;
the oxygen added into the process gas is increased and decreased after the plasma is stabilized.

* * * * *